(12) United States Patent
Lee et al.

(10) Patent No.: US 9,837,500 B2
(45) Date of Patent: Dec. 5, 2017

(54) SEMICONDUCTOR DEVICES INCLUDING SOURCE/DRAIN REGIONS HAVING SILICON CARBON

(71) Applicant: Samsung Electronics Co., Ltd., Suwon-si (KR)

(72) Inventors: Hyunjung Lee, Suwon-si (KR); Keumseok Park, Seoul (KR); Jinyeong Joe, Suwon-si (KR); Yong-Suk Tak, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 15/002,379

(22) Filed: Jan. 20, 2016

(65) Prior Publication Data

US 2016/0315160 A1 Oct. 27, 2016

(30) Foreign Application Priority Data

Apr. 21, 2015 (KR) .............................. 2015-0056098

(51) Int. Cl.
*H01L 29/417* (2006.01)
*H01L 23/535* (2006.01)
*H01L 29/78* (2006.01)

(52) U.S. Cl.
CPC ...... *H01L 29/41791* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 7,781,799 B2 | 8/2010 | Yu et al. | |
| 8,906,789 B2 | 12/2014 | Tsai et al. | |
| 2013/0015525 A1 | 1/2013 | Cheng et al. | |
| 2013/0020648 A1 | 1/2013 | Wu et al. | |
| 2014/0252412 A1 | 9/2014 | Tsai et al. | |
| 2014/0374830 A1* | 12/2014 | Jeong | H01L 29/7855 257/365 |
| 2015/0162331 A1* | 6/2015 | Kang | H01L 22/34 257/48 |
| 2015/0318399 A1* | 11/2015 | Jeong | H01L 29/7853 257/401 |
| 2016/0027918 A1 | 1/2016 | Kim et al. | |
| 2016/0111506 A1* | 4/2016 | Lee | H01L 29/41775 257/401 |

* cited by examiner

*Primary Examiner* — Whitney T Moore
(74) *Attorney, Agent, or Firm* — Muir Patent Law, PLLC

(57) ABSTRACT

Provided is a semiconductor device. In some examples, the semiconductor device includes an fin active region protruding from a substrate, gate patterns disposed on the fin active region, a source/drain region disposed on the fin active region between the gate patterns, and contact patterns disposed on the source/drain region. The source/drain region may have a protruding middle section, which may form a wave-shaped upper surface of the source/drain region.

20 Claims, 28 Drawing Sheets

SEMICONDUCTOR DEVICES INCLUDING SOURCE/DRAIN REGIONS HAVING SILICON CARBON

CROSS-REFERENCE TO RELATED APPLICATION

This application claims priority under 35 U.S.C. §119 to Korean Patent Application No. 10-2015-0056098 filed on Apr. 21, 2015, the disclosure of which is hereby incorporated by reference in its entirety.

BACKGROUND

Technical Field

Embodiments of the inventive concept provide semiconductor devices including source/drain regions having silicon carbon (SiC) and methods of fabricating the same.

Description of Related Art

In order to increase mobility of electrons as a carrier of NMOS, straining techniques have been suggested that apply stress to channel regions or source/drain regions. To apply stress to channel regions or source/drain regions, a technique forming a silicon carbon (SiC) layer in the channel regions or the source/drain regions has been researched and developed. As carbon-containing ratio is higher in the silicon carbon (SiC) layer, the stress applied to the channel regions and the source/drain region is greater. Accordingly, it is preferable that carbon (C) is sufficiently included in the silicon carbon (SiC) layer.

SUMMARY

Embodiments of the inventive concept provide source/drain regions including a silicon carbon (SiC) layer in which carbon is sufficiently included, and a semiconductor device including the source/drain regions.

Other embodiments of the inventive concept provide methods of forming source/drain regions including a silicon carbon (SiC) layer in which carbon is sufficiently included, and methods of forming a semiconductor device including the source/drain regions.

The technical objectives of the inventive concept are not limited to the above disclosure. Other objectives may become apparent to those of ordinary skill in the art based on the following descriptions.

In accordance with an aspect of the inventive concept, a semiconductor device includes an active fin protruding from a substrate, gate patterns on the fin active region, a source/drain region on the fin active region between the gate patterns, and contact patterns on the source/drain region. The source/drain region has a wave-shaped upper surface.

The substrate may include at least one of a single crystalline silicon wafer and a silicon wafer having a silicon germanium layer.

The gate patterns may include interfacial insulating layers directly on the fin active region, gate insulating layers on the interfacial insulating layers, gate barrier layers on the gate insulating layers, and gate electrodes on the gate barrier layers.

The interfacial insulating layers may conformally cover a surface of the fin active region.

The interfacial insulating layers may include silicon oxide formed by oxidizing the surface of the fin active region.

The gate insulating layers may include a metal oxide having higher permittivity than silicon oxide.

The source/drain region may include silicon carbon (SiC).

The device may further include a capping source/drain region on the source/drain region.

The capping source/drain region may include epitaxially grown silicon (Si).

The capping source/drain region may have a substantially flat upper surface.

The capping source/drain region may have a curved upper surface.

The contact pattern may include a silicide layer on the source/drain region, a contact barrier layer on the silicide layer, and a contact plug on the contact barrier layer.

The source/drain region may include a recessed upper surface, and the silicide layer may be formed on the recessed upper surfaces of the source/drain region to have a bowl shape.

The silicide layer of the contact pattern may be in contact with the source/drain region.

In accordance with another aspect of the inventive concept, the semiconductor device includes a substrate provided with a fin active region, gate patterns disposed on the fin active region, a source/drain region protruding from the fin active region between the gate patterns, and a contact pattern disposed on the source/drain region. The source/drain region includes a lower source/drain region and a capping source/drain region on the lower source/drain region, and an interfacial between the lower source/drain region and the capping source/drain region has a wave shape.

The lower source/drain region may be disposed within a trench formed in the fin active region, and the capping source/drain region may be disposed on the lower source/drain region to protrude above the surface of the fin active region.

The semiconductor device may further include gate spacers disposed on sidewalls of the gate patterns. The capping source/drain region may be in contact with the gate spacers.

The interfacial may include a protruding center portion, a recessed inner portion around the center portion, and an outer portion around the inner portion. The outer portion may be located at a level lower than the center portion and higher than the inner portion.

In accordance with still another aspect of the inventive concept, the semiconductor device includes a substrate provided with a protruding fin active region, a lower source/drain region disposed on the fin active region with a depression of the fin active region, and having a curved upper surface and single crystalline silicon carbon (SiC), a capping source/drain region directly disposed on the lower source/drain region and having a single crystalline silicon (Si), and a contact pattern directly disposed on the capping source/drain region.

The capping source/drain region may include an upwardly protruding center portion.

In accordance with yet another aspect of the inventive concept, the semiconductor device includes a substrate provided with fin active regions, the fin active regions extending parallel to each other, gate patterns extending parallel to each other and crossing the fin active regions, source/drain regions formed on the fin active regions in recesses in the fin active regions between the gate patterns, and contact patterns disposed on the source/drain regions. The source/drain regions include lower source/drain regions disposed in the recesses of the fin active regions, and upper source/drain regions protruding above surfaces of the fin active regions. Each lower source/drain region includes a protruding center portion and a recessed inner portion adjacent to a corresponding center portion.

The contact patterns may include silicide layers disposed on the upper source/drain regions, contact barrier layers disposed on the silicide layers, and contact plugs disposed on the contact barrier layers. The silicide layers and the contact barrier layers may extend into the upper source/drain regions. The strained source/drain regions may have protruding center portions and recessed inner portions around the center portions.

The contact patterns may be in contact with the lower source/drain regions.

The gate patterns may include interfacial insulating layers directly disposed on the fin active regions and having a sheet shaped cross section, gate insulating layers disposed on the interfacial insulating layers and having a U-shaped cross section, gate barrier layers directly disposed on the gate insulating layers and having a U-shaped cross section, and gate electrodes on the gate barrier layers.

The center portions of the lower source/drain regions may protrude over the fin active regions.

Certain aspects of the disclosure provides a semiconductor device including a substrate provided with a fin active region, a gate pattern formed on the fin active region, and source/drain regions formed on either side of the gate pattern, wherein the source/drain regions comprise first regions having silicon carbon (SiC), atomic concentration of carbon in the SiC is in a range of 0.8% to 3.5% and a top surface of the first regions has a wave shaped cross-section.

The SiC may be crystalline silicon carbon, and the atomic concentration of carbon in the SiC may be in a rage of 1.8% to 3.5%. The source/drain regions may include second regions formed on the first regions and having crystalline silicon, and a top surface of the second regions has a wave shaped cross-sectional view. The source/drain regions may include second regions on the first regions and being formed of crystalline silicon, and a top surface of the second regions being substantially flat with respect to a vertical cross-sectional view.

The semiconductor device may further include contact patterns formed on the source/drain regions, wherein the contact patterns may include silicide layers formed on the source/drain regions, contact barrier layers formed on the silicide layers, and contact plugs formed on the silicide layers, wherein the silicide layers may be in contact with the first regions of the source/drain regions.

The semiconductor device may further include contact patterns formed on the source/drain regions, wherein the source/drain regions may further include second regions having crystalline silicon and the second regions may be formed on the first regions, wherein the contact patterns may include silicide layers formed on the source/drain regions, contact barrier layers formed on the silicide layers, and contact plugs formed on the silicide layers, wherein the silicide layers may be in contact with the second regions of the source/drain regions.

The source/drain regions may further include second regions formed of crystalline silicon, the second regions being formed on the first regions, and the second regions being in contact with the fin active region. A top surface of the first regions of the source/drain regions may be higher than a bottom surface of the gate pattern. The semiconductor device may further include an inner gate spacer and an outer gate spacer formed between the gate pattern and the source/drain regions, wherein the first regions of the source/drain regions may be in contact with the outer gate spacer.

Details of other embodiments are included in detailed explanations and the drawings.

BRIEF DESCRIPTION OF THE DRAWINGS

The foregoing and other features and advantages of the inventive concepts will be apparent from more particular description of embodiments of the inventive concepts, as illustrated in the accompanying drawings in which like reference characters refer to like parts throughout different drawings. The drawings are not necessarily to scale, emphasis instead being placed upon illustrating the principles of the inventive concepts. In the drawings.

DETAILED DESCRIPTION

Figure 1:
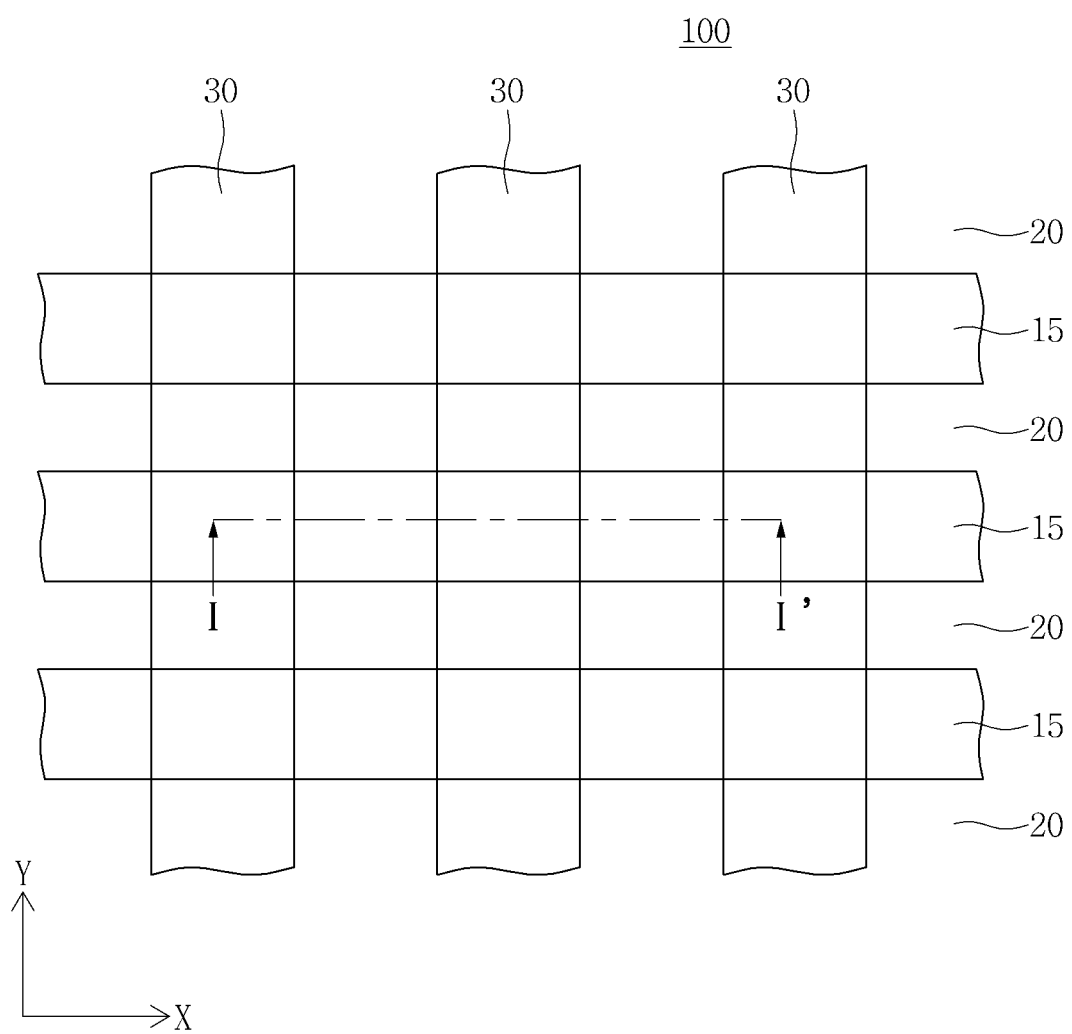
FIG. 1 is a layout of a semiconductor device 100 in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there is no intervening element or layer present. In the following explanation, the same reference numerals denote the same or the like components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both orientations of above and below. The device may be otherwise oriented (rotated 90 degrees or at other orientations) and the spatially relative descriptors used herein may be interpreted accordingly.

The exemplary embodiments of the inventive concept will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the embodiments of the inventive concept are not intended to be limited to illustrated specific forms, but include modifications of forms generated according to manufacturing processes. For example, an etching area illustrated at a right angle may be round or have a predetermined curvature. Therefore, areas illustrated in the drawings have overview properties, and shapes of the areas are illustrated as special forms of the areas of a device, and are not intended to be limited to the scope of the inventive concept.

Hereinafter, like reference numerals in the drawings denote like elements. Therefore, although like reference numerals or similar reference numerals are not mentioned nor described in the drawing, it will be described with reference to another drawing. Further, although reference numerals are not illustrated, it will be described with reference to another drawing.

FIG. 1 is a layout of a semiconductor device 100 in accordance with an embodiment of the inventive concept. Referring to FIG. 1, a semiconductor device 100 in accordance with an embodiment of the inventive concept may include fin active regions 15 extending in an X-direction and parallel to each other and gate patterns 30 extending in a Y-direction and parallel to each other so as to perpendicularly intersect the fin active regions 15. Isolation regions 20 defining the fin active regions 15 may be disposed between the fin active regions 15.

Figure 2A:
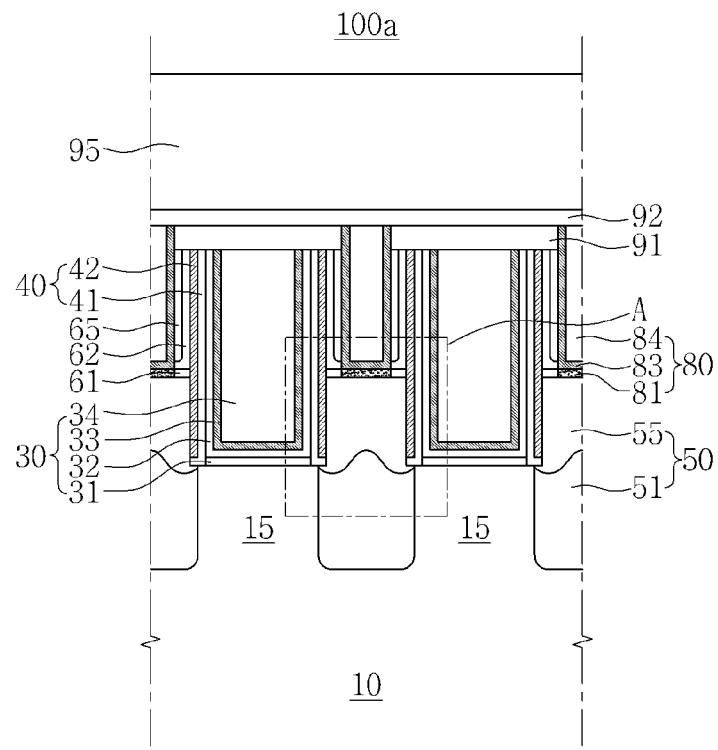
FIGS. 2A to 2C are cross sectional views taken along the line I-I' of FIG. 1 for describing semiconductor devices according to various embodiments of the inventive concept.
Figure 2B:
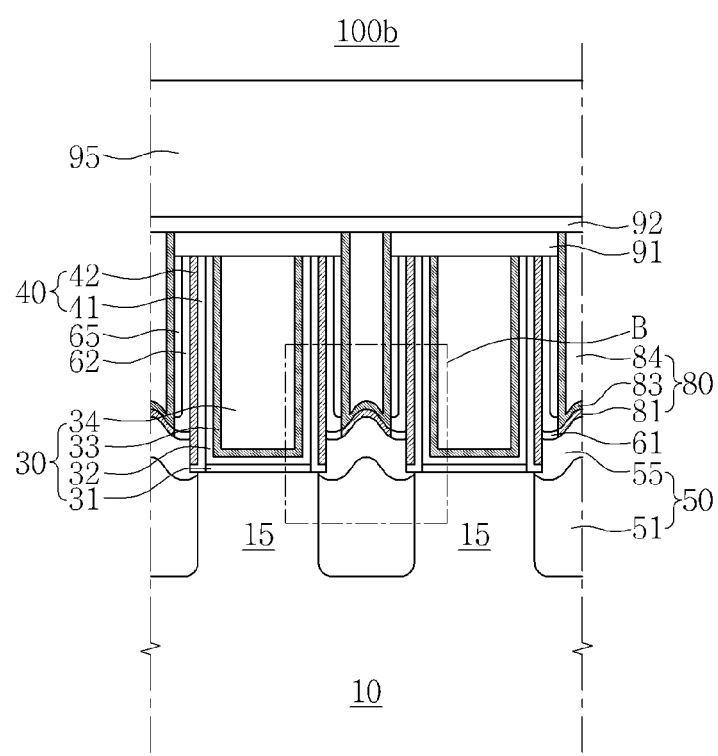
Figure 2C:
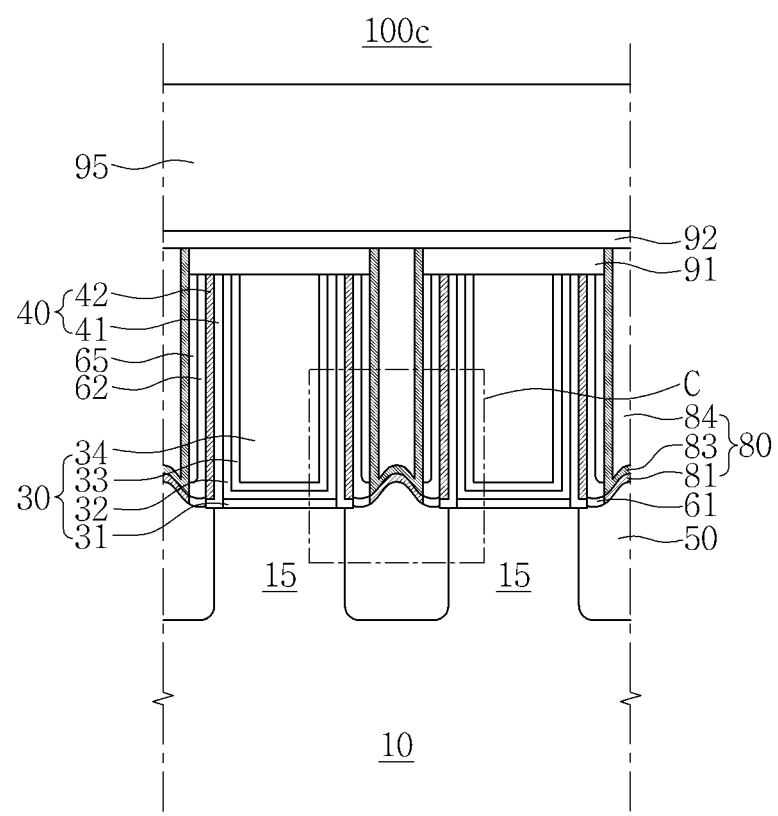

FIGS. 2A to 2C are cross sectional views taken along the line I-I' of FIG. 1 for describing semiconductor devices according to various embodiments of the inventive concept.

Referring to FIG. 2A, a semiconductor device 100a in accordance with an embodiment of the inventive concept may include protruding fin active regions 15, gate patterns 30, source/drain regions 50, and contact patterns 80 on a substrate 10.

The substrate 10 may include silicon wafer and/or SiGe-on-Si wafer.

The fin active regions 15 may be portions of the substrate 10. For example, the fin active regions 15 may be portions protruding from the substrate 10.

The gate patterns 30 may perpendicularly intersect the fin active regions 15. The gate patterns 30 may include interfacial insulating layers 31, gate insulating layers 32, gate barrier layers 33, and gate electrodes 34.

The interfacial insulating layers 31 may be directly formed on surfaces of the fin active regions 15. The interfacial insulating layers 31 may have a sheet shape conformally covering the surfaces of the fin active regions 15. The interfacial insulating layers 31 may include oxidized silicon formed by oxidizing the surfaces of the fin active regions 15. In some embodiments, the interfacial insulating layers 31 may be omitted.

The gate insulating layers 32 may be formed on the interfacial insulating layers 31 or the fin active regions 15 to have a U-shaped cross section. The gate insulating layers 32 may include at least one of metal oxides (e.g., hafnium oxide (HfO), aluminum oxide (AlO), or titanium oxide (TiO)) having higher dielectric permittivity than silicon oxide ($SiO_2$).

The gate barrier layers 33 may be formed on bottom surfaces and inner walls of the gate insulating layers 32 to have a U-shaped cross section. The gate barrier layers 33 may include titanium (Ti), titanium nitride (TiN), tantalum (Ta), tantalum nitride (TaN), and/or other barrier metals.

The gate electrodes 34 may be formed on bottom surfaces and inner walls of the gate barrier layers 33 to be surrounded by the gate barrier layers 33. The gate electrodes 34 may include at least one of tungsten (W), copper (Cu), and titanium (Ti). The gate electrodes 34 may include a single layer or multi layered metals and/or metal compounds.

The source/drain regions 50 may be formed between the fin active regions 15 and protrude from the surfaces of the fin active regions 15. The source/drain regions 50 may include strained source/drain regions 51 and capping source/drain regions 55. For example, the strained source/drain regions 51 may apply a stress (e.g., a tensile stress) to an adjacent region, layer, or structure. For example, the strained source/drain regions 51 may be formed of a crystalline material having a lattice constant lower than a lattice constant of a crystalline material of a contacting adjacent region, layer or structure.

The strained source/drain regions 51 may be formed between the fin active regions 15. The strained source/drain regions 51 may have wave-shaped upper surfaces. For example, interfaces between the strained source/drain regions 51 and the capping source/drain regions 55 may have a wave shape. For example, the interfaces or the upper surfaces of the strained source/drain regions 51 may have protruding center portions, recessed inner portions adjacent to the center portions, and outer portions outside of the inner portions lower than the center portions and higher than the recessed inner portions. For example, a vertical distance of the top of the protruding center portions above the height of the bottom of the recessed inner portion surfaces may be greater than 1.5 times or greater than 2 times a vertical distance of the top of the outer portions above the bottom of the recessed inner portions. The strained source/drain regions 51 may include single crystalline silicon carbon (SiC). The concentration of carbon in SiC may affect the strain of the strained source/drain regions 51. In some examples, the concentration of carbon of SiC in the strained source/drain regions 51 may have an atomic concentration of 0.8% or higher (e.g., 0.8% to 3.5%). In some examples, the atomic concentration of carbon of SiC in the strained source/drain regions 51 may be 1.8% or higher (e.g., 1.8% to 3.5%) to beneficially affect the strain of the strained source/drain regions 51.

The capping source/drain regions 55 may protrude above the upper surfaces of the fin active regions 15. The capping source/drain regions 55 may include smooth or flat surfaces. Accordingly, the source/drain regions 50 may include the strained source/drain regions 51 having the wave-shaped upper surfaces and the capping source/drain regions having the flat upper surfaces. The capping source/drain regions 55 may include epitaxially grown single crystalline silicon (Si).

The contact patterns 80 may be formed on the source/drain regions 50. The contact patterns 80 may include silicide layers 81, contact barrier layers 83, and contact plugs 84. The silicide layers 81 may be directly formed on the source/drain regions 50. The silicide layers 81 may include one or more of tungsten silicide (WSi), nickel silicide (NiSi), titanium silicide (TiSi), cobalt silicide (CoSi), and/or other metal silicides. The contact barrier layers 83 may be formed on the silicide layers 81 to have a U-shaped cross section. The contact barrier layers 83 may include one or more of titanium (Ti), titanium nitride (TiN), tantalum (Ta), tantalum nitride (TaN), and/or other barrier metals. The contact plugs 84 may be formed on bottom surfaces and inner walls of the contact barrier layers 83 to be surrounded by the contact barrier layers 83. For example, the contact plugs 84 may fill up a space defined by the contact barrier layers 83. The contact plugs 84 may include one or more of tungsten (W), copper (Cu), titanium (Ti), and/or other metal compounds.

The semiconductor device 100a may further include gate spacers 40 formed on outer sidewalls of the gate patterns 30. The gate spacers 40 may include inner gate spacers 41 and outer gate spacers 42. The inner gate spacers 41 may be directly formed on the outer sidewalls of the gate patterns 30. For example, the inner gate spacers 41 may be in contact with the outer sidewalls of the gate patterns 30. For example, the inner gate spacers 41 may have L shape in a cross-sectional view. Vertical portions of the L shapes may be in contact with the gate barrier layers 33, and horizontal portions of the L shapes may be in contact with the source/drain regions 50. The vertical portions of the L shapes may not extend straight up or down, but be slanted. The horizontal portions may slant as well. The horizontal portions of the L shapes may extend above the fin active regions 15 and the source/drain regions 50. The inner gate spacers 41 may include silicon nitride (SiN). The outer gate spacers 42 may be formed on outer sidewalls of the inner gate spacers 41. The outer gate spacers 42 may include one or more of silicon carbon oxide (SiCO), silicon oxynitride (SiON), and silicon carbooxynitride (SiCON) to have an etch selectivity with respect to the inner gate spacers 41.

The semiconductor device 100a may further include buffer layers 61, stopper layers 62, and lower interlayer insulating layers 65 on the source/drain regions 50. The buffer layers 61 may be directly formed on the upper surfaces of the source/drain regions 50. The buffer layers 61 may include oxidized silicon formed by oxidizing the surfaces of the source/drain regions 50. The stopper layers 62 may be conformally formed on the buffer layers 61 and the outer gate spacers 42 on the capping source/drain regions 55. For example, the stopper layers 62 may have L shape in a cross-sectional view. Horizontal portions of the L shapes may be in contact with the buffer layers 61. Vertical portions of the L shapes may be in contact with the gate spacers 40. The vertical portions of the L shapes of the stopper layers 62 may not extend straight up and down, but be slanted. The horizontal portions of the L shapes may also be slanted. The stopper layers 62 may include silicon nitride (SiN). The lower interlayer insulating layers 65 may include silicon oxide ($SiO_2$). The buffer layers 61, the stopper layers 62, and the lower interlayer insulating layers 65 may surround sidewalls of the contact patterns 80. In some embodiments, the buffer layers 61, the stopper layers 62, and the lower interlayer insulating layers 65 may be removed so that the sidewalls of the contact patterns 80 may be in direct contact with the gate spacers 40. Upper surfaces of the gate patterns 30, the gate spacers 40, the stopper layers 62, and the lower interlayer insulating layers 65 may be coplanar.

Lower capping layers 91 may be formed on the gate patterns 30, the gate spacers 40, the stopper layers 62, and the lower interlayer insulating layers 65. The lower capping layers 91 may include silicon nitride (SiN). Upper surfaces of the contact patterns 80 and the lower capping layers 91 may be coplanar. An upper capping layer 92 may be formed on the contact patterns 80 and lower capping layers 91. The upper capping layers 92 may include silicon nitride (SiN).

An upper interlayer insulating layer 95 may be formed on the upper capping layer 92. The upper capping layer 92 may include silicon oxide ($SiO_2$).

Referring to FIG. 2B, a semiconductor device 100b in accordance with an embodiment of the inventive concept may include a capping source/drain regions 55 having wave-shaped upper surfaces. Accordingly, the strained source/drain regions 51 and the capping source/drain regions 55 of the source drain regions 50 may include curved upper surfaces in a wave shape. For example the strained source/drain regions 51 may have wave-shaped upper surfaces which a vertical distance of the top of the protruding center portions above the height of the bottom of the recessed inner portion surfaces may be greater than 1.5 times or greater than 2 times a vertical distance of the top of the outer portions above the bottom of the recessed inner portions.

Referring to FIG. 2C, a semiconductor device 100c in accordance with an embodiment of the inventive concept may not include the capping source/drain regions 55. For example, the capping source/drain regions 55 shown in FIGS. 2A and 2B may be omitted so that the contact patterns 80 may be directly formed on the strained source/drain regions 51. Other features of FIG. 2C may be the same as that described and shown with respect to FIGS. 2A and 2B.

FIGS. 3A to 5C are enlarged views of the area A of FIG. 2A, FIGS. 6A to 8C are enlarged views of the area B of FIG. 2B, and FIGS. 9A to 10B are enlarged views of the area C of FIG. 2C to illustrate the source/drain regions 50 and contact patterns 80 according to various embodiments of the inventive concepts.

Figure 3A:
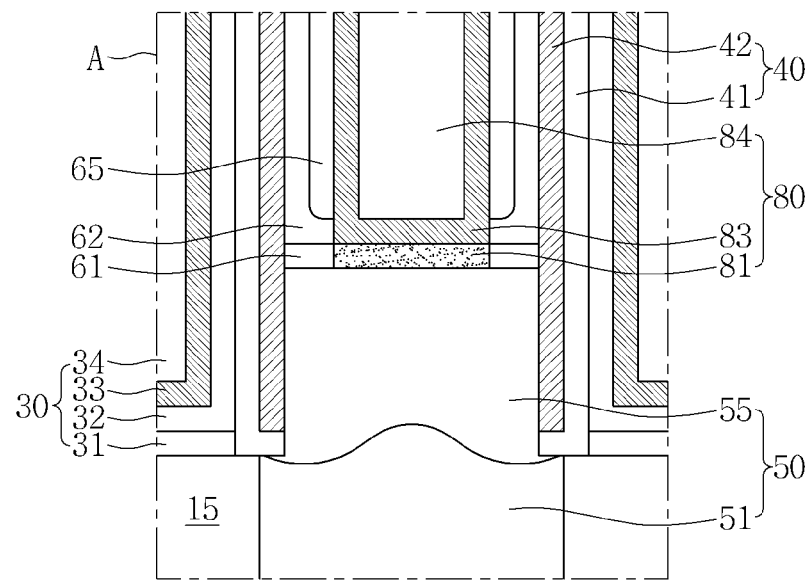
FIGS. 3A to 5C are enlarged views of an area A of FIG. 2A, FIGS. 6A to 8C are enlarged views of an area B of FIG. 2B, and FIGS. 9A to 10B are enlarged views of an area C of FIG. 2C to illustrate the source/drain regions and contact patterns according to various embodiments of the inventive concepts.

Referring to FIG. 3A, a source/drain regions 50 of a semiconductor device 100a according to an embodiment of the inventive concept may include a strained source/drain region 51 having an upper surface adjacent to the upper surface of a fin active region 15 and a capping source/drain region 55 having a substantially smooth upper surface. The capping source/drain region 55 may be formed on the strained source/drain region 51. For example, the interface of the strained source/drain region 51 and the capping source/drain region 55 may be adjacent to the upper surface of the fin active region 15 or in contact with an inner gate spacer 41. An upper surface of a silicide layer 81 of a contact pattern 80 may be at a higher level than an upper surface of the fin active region 15. For example, the interface may include a protruding center portion, a recessed inner portion around the center portion, and an outer portion around the inner portion. An upper surface of the outer portion may be lower than an upper surface of the center portion and higher than an upper surface of the inner portion.

Figure 3B:
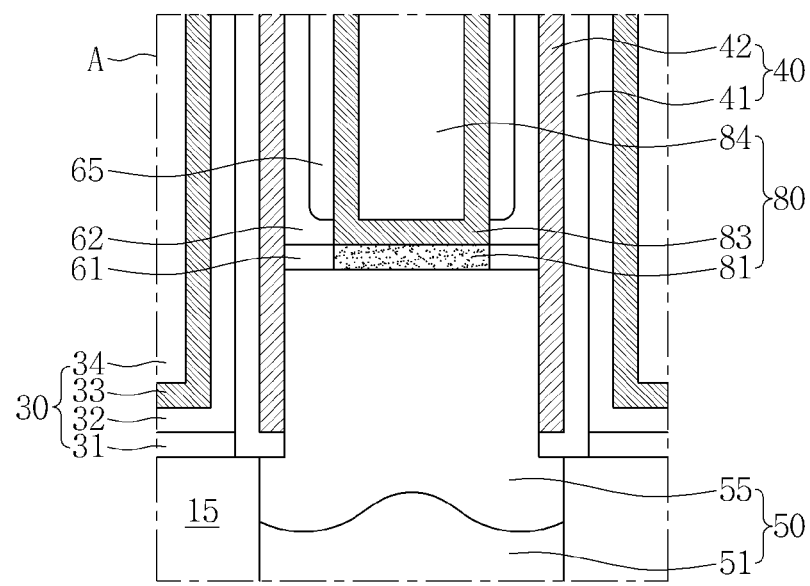

Referring to FIG. 3B, a source/drain region 50 of a semiconductor device 100a according to an embodiment of the inventive concept may include a strained source/drain region 51 having an upper surface lower than the upper surface of a fin active region 15 and a capping source/drain region 55 having a substantially smooth and/or flat upper surface, at least with respect to a vertical cross section, such as that shown in FIG. 3B. The capping source/drain region 55 may be formed on the strained source/drain region 51. For example, the interface of the strained source/drain region 51 and the capping source/drain region 55 may be in contact with the insides of the fin active region 15. Sidewalls of the capping source/drain region 55 may be in contact with fin active regions 15.

Figure 3C:
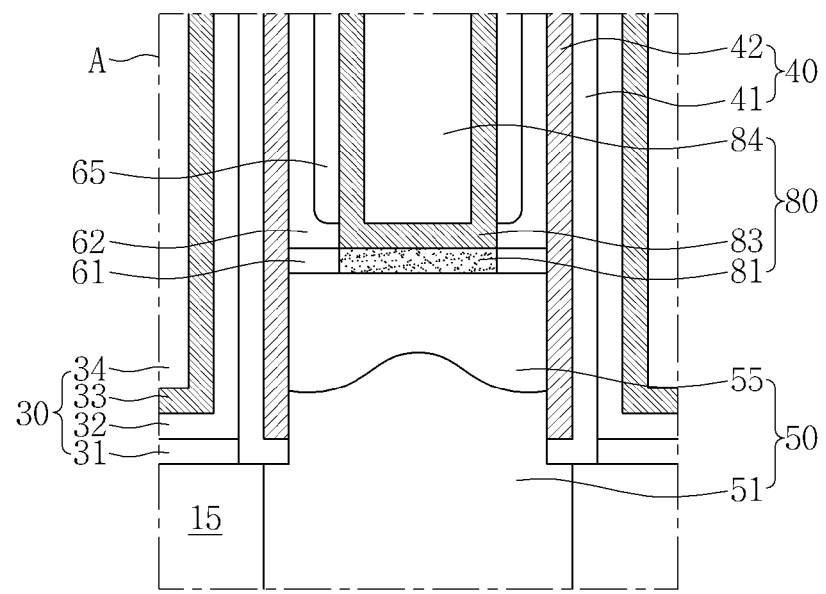

Referring to FIG. 3C, a source/drain region 50 of a semiconductor device 100a according to an embodiment of the inventive concept may include a strained source/drain region 51 having an upper surface higher than the upper surface of the fin active region 15 and a capping source/drain region 55 on the strained source/drain region 51. For example, both sidewalls of the strained source/drain region 51 and the capping source/drain region 55 may be in contact with outer gate spacers 42.

Figure 4A:
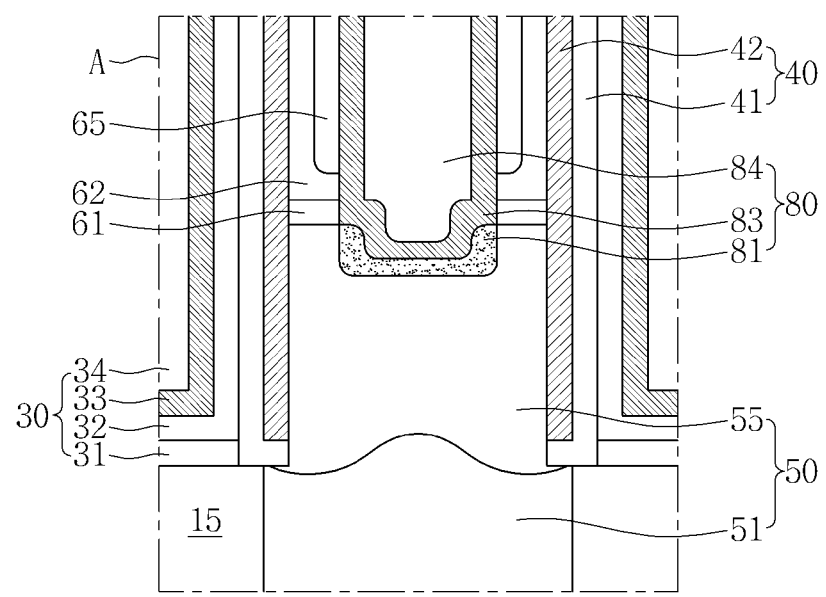
Figure 4B:
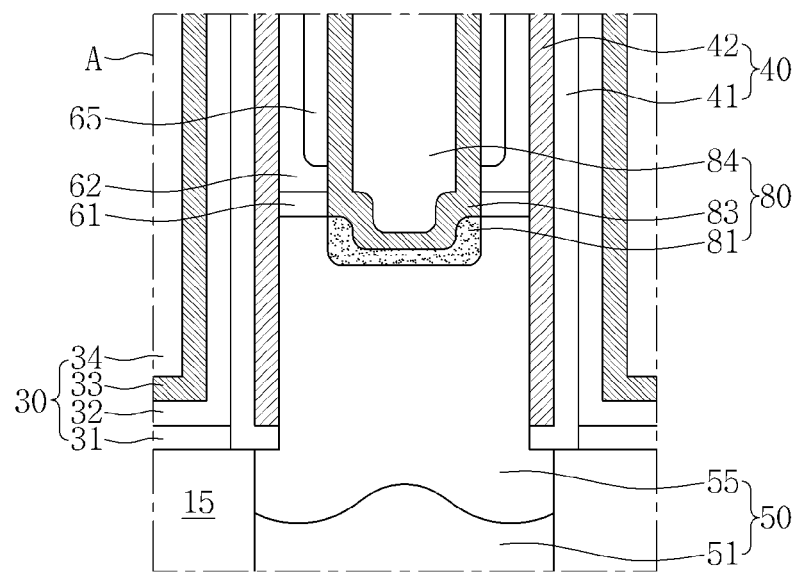
Figure 4C:
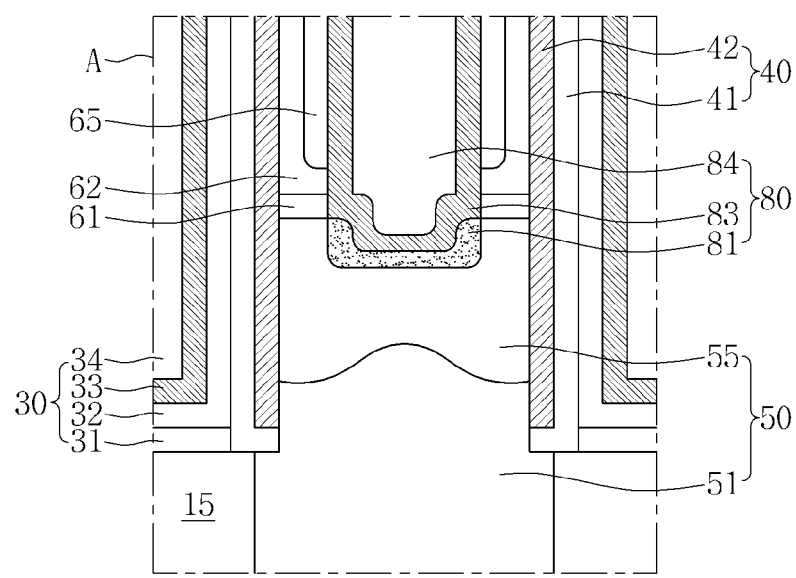

Referring to FIGS. 4A to 4C, source/drain regions 50 of semiconductor devices 100a in accordance with various embodiments of the inventive concept may include capping source/drain regions 55 having recessed upper surfaces. For example, the semiconductor devices 100a may include the capping source/drain regions 55 having the recessed upper surfaces and contact patterns 80 vertically aligned with the recessed upper surface. Silicide layers 81 of the contact patterns 80 may be formed on the recessed upper surfaces of the capping source/drain regions 55. For example, the silicide layers 81 and/or contact barrier layers 83 may protrude into the inside of the capping source/drain regions 55. The silicide layers 81 and the contact barrier layers 83 of the contact patterns 80 may have bowl-shaped cross sections or U-shaped cross sections.

Figure 5A:
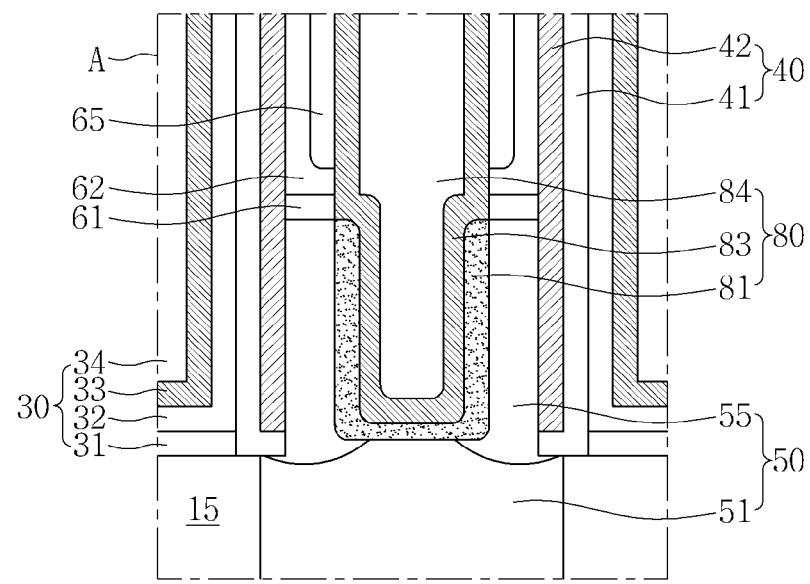
Figure 5B:
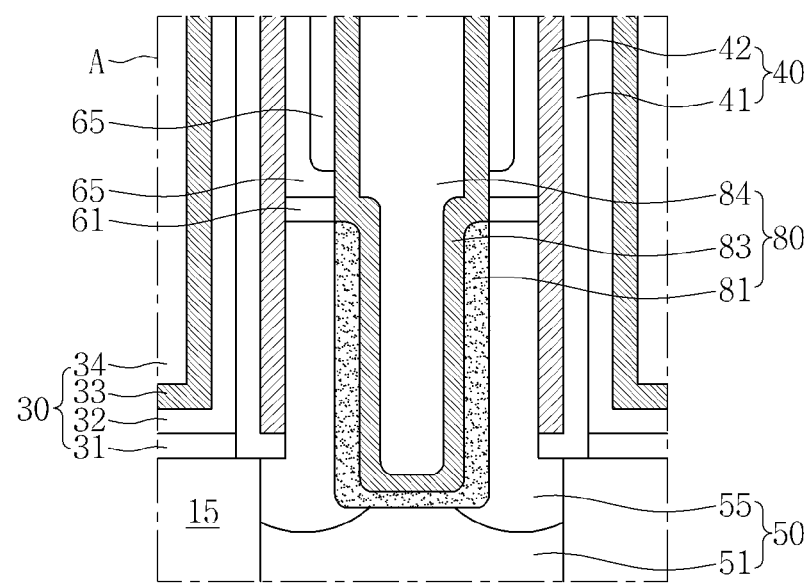
Figure 5C:
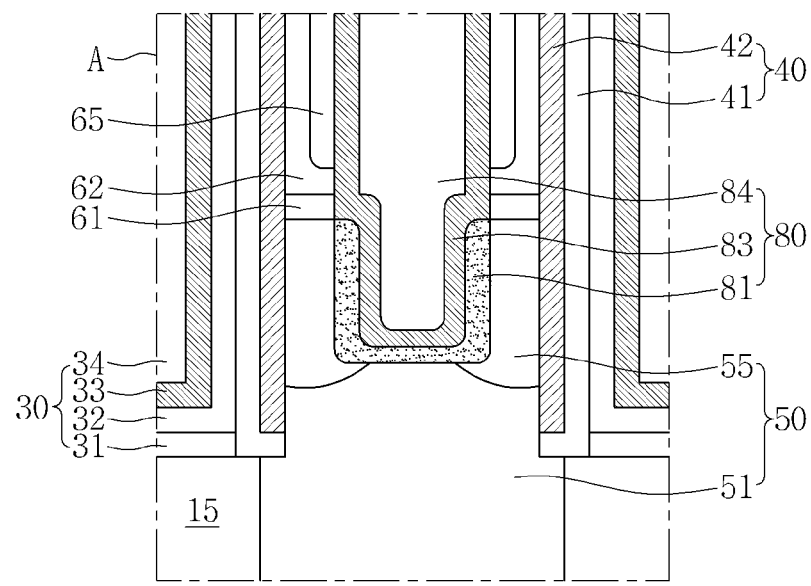

Referring to FIGS. 5A to 5C, the contact patterns 80 of the semiconductor devices 100a in accordance with various embodiments of the inventive concept may be in contact with the strained source/drain regions 51 of the source/drain regions 50. For example, the contact patterns 80 vertically passing through the capping source/drain regions 55 may be in contact with the strained source/drain regions 51. Sidewalls of the silicide layers 81 may be in contact with the capping source/drain regions 55 and bottoms of the silicide layers 81 may be in contact with the strained source/drain regions 51.

In some embodiments, the contact patterns 80 may pass through the capping source/drain regions 55 to be deeper than the capping source/drain regions 55 so that the sidewalls of the silicide layers 81 may be in contact with the strained source/drain regions 51. For example, the bottoms of the silicide layers 81 may be in complete contact with the strained source/drain regions 51.

Figure 6A:
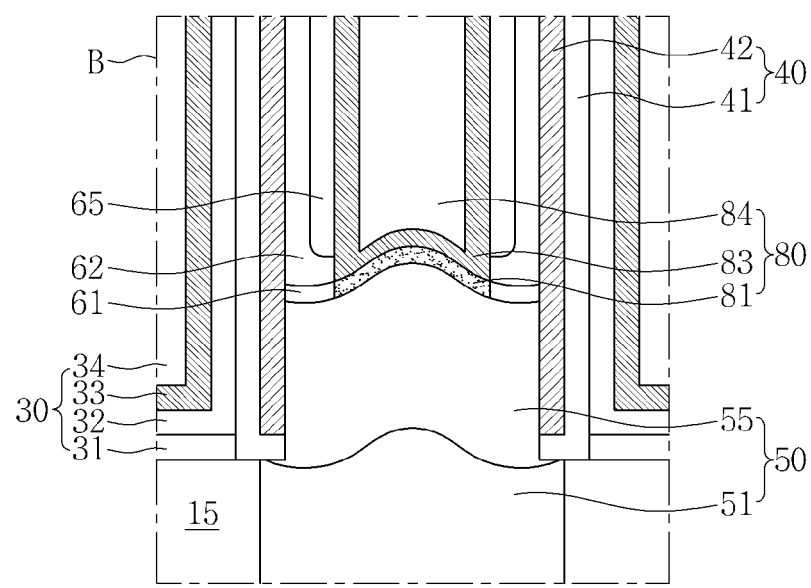
Figure 6B:
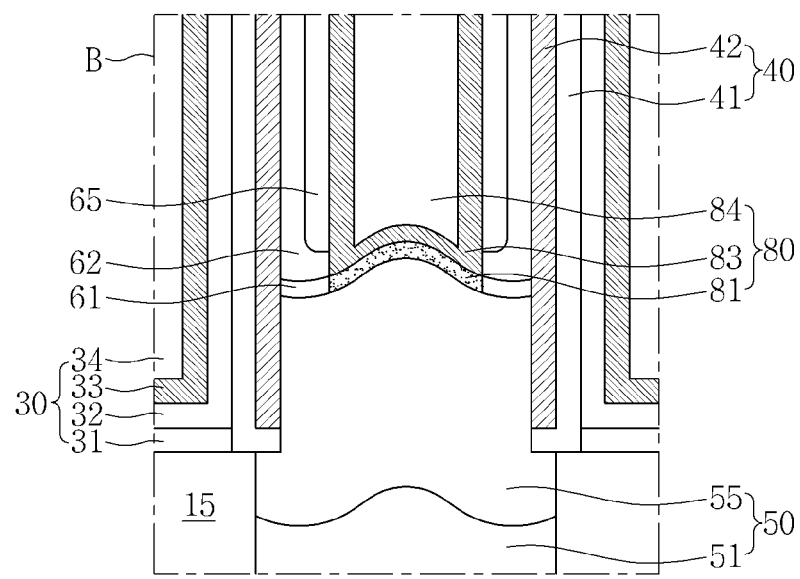
Figure 6C:
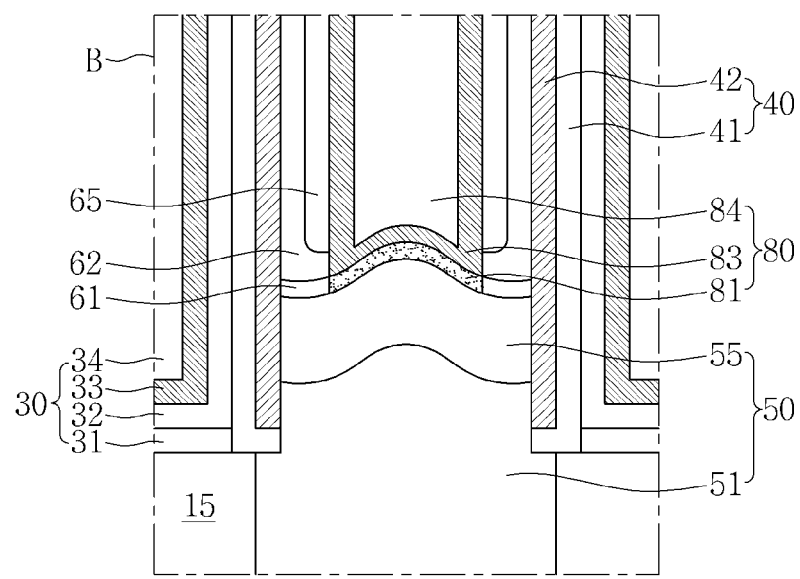

Referring to FIGS. 6A to 6C, the source/drain regions 50 of the semiconductor devices 100b in accordance with various embodiments of the inventive concept may include capping source/drain regions 55 having curved or wave-shaped upper surfaces. For example, the capping source/drain regions 55 may include protruding center portions at a level higher than inner portions disposed outsides of the center portions. Profiles of the upper surfaces of the capping source/drain regions 55 may be similar to profiles of the upper surfaces of the strained source/drain regions 51. Silicide layers 81 of the contact patterns 80 may be formed on the curved or wave-shaped upper surfaces of the capping source/drain regions 55. Upper surfaces of the silicide layers 81 may be curved along the profiles of the upper surfaces of the capping source/drain regions 55. Bottoms of contact barrier layers 83 of the contact patterns 80 may be curved along the profiles of the upper surfaces of the silicide layers 81.

Figure 7A:
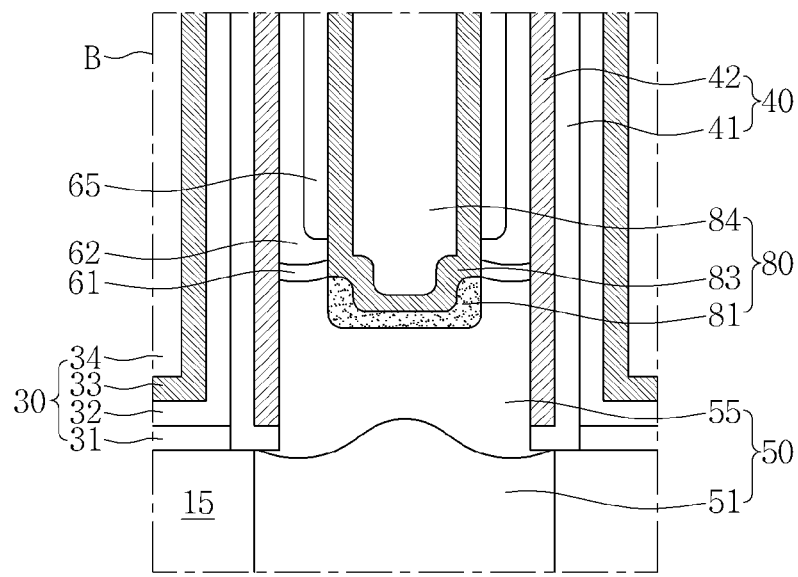
Figure 7B:
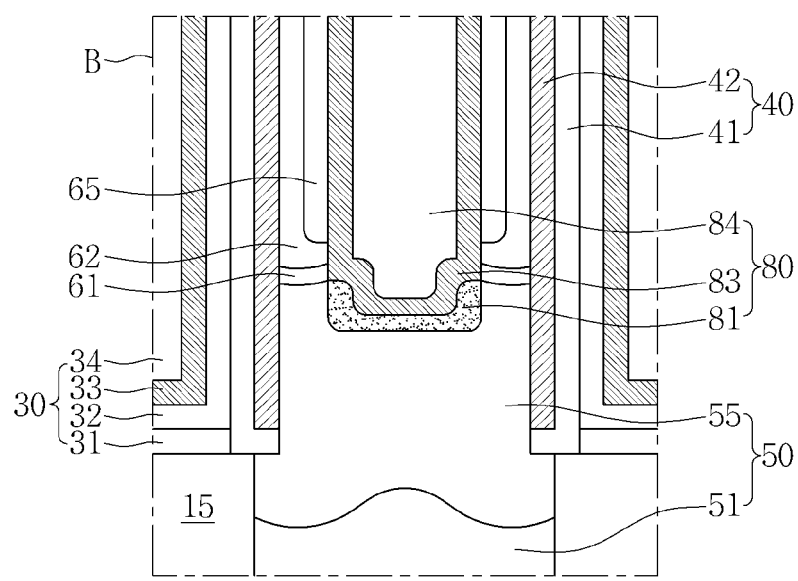
Figure 7C:
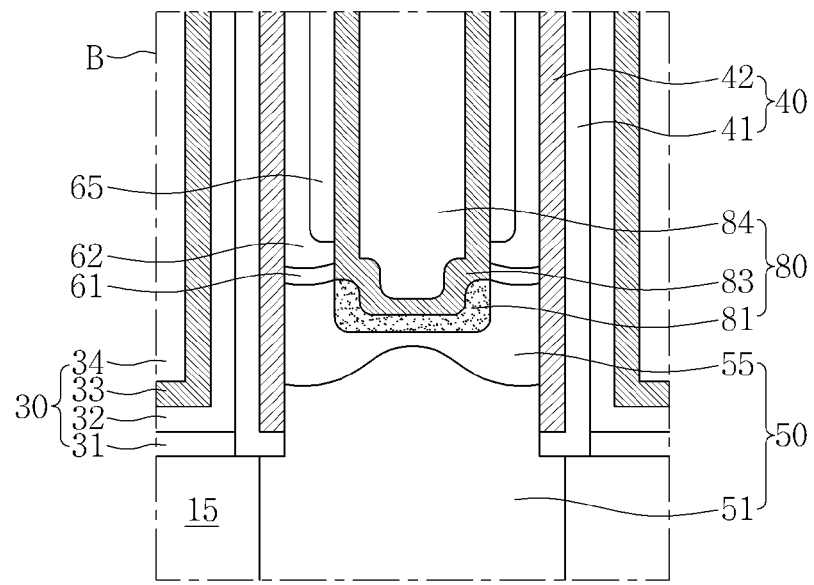

Referring to FIGS. 7A to 7C, source/drain regions 50 of semiconductor devices 100b according to various embodiments of the inventive concept may include capping source/drain regions 55 having curved and recessed upper surfaces. For example, the semiconductor devices 100b may include contact patterns 80, capping source/drain regions 55 having recessed upper surfaces, and silicide layers 81 formed on the recessed upper surfaces. The silicide layers 81 and contact barrier layers 83 of the contact patterns 80 may have bowl shaped cross sections and/or U-shaped cross sections.

Figure 8A:
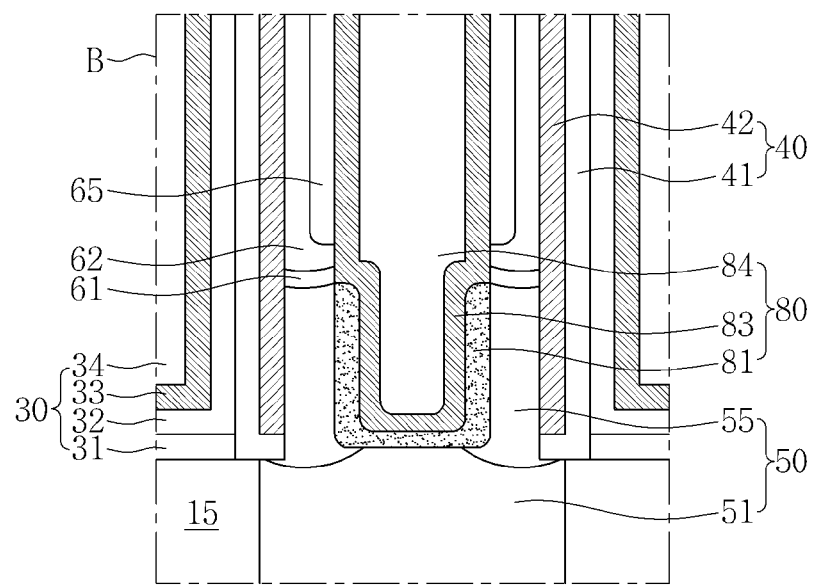
Figure 8B:
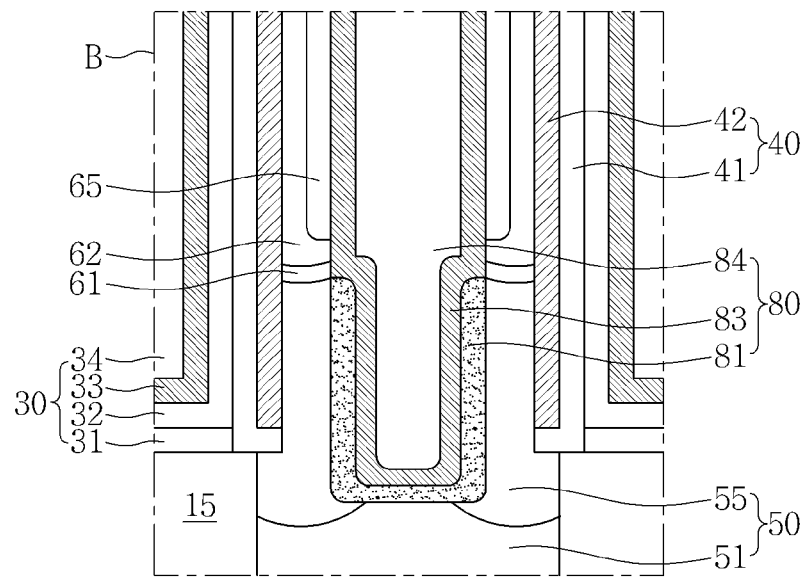
Figure 8C:
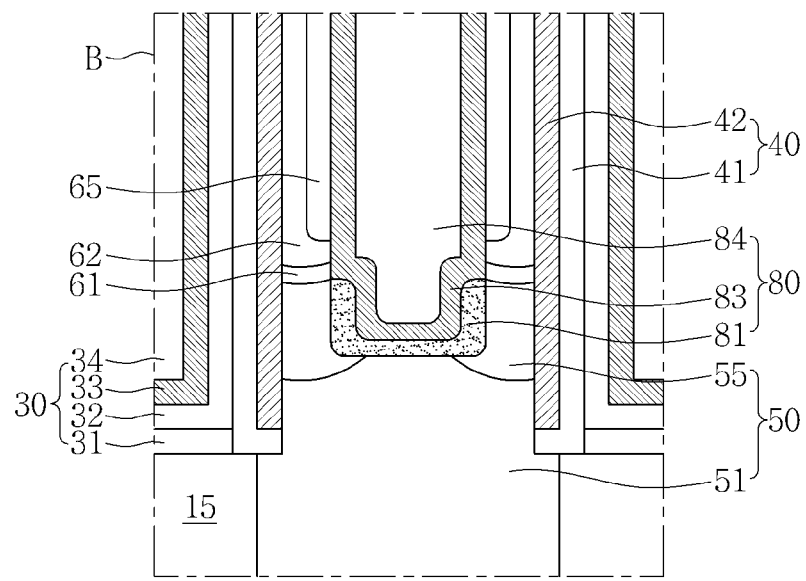

Referring to FIGS. 8A to 8C, semiconductor devices 100b according to various embodiments of the inventive concepts may include contact patterns 80 having silicide layers 81 being in contact with strained source/drain regions 51. For example, the contact patterns 80 may be in contact with the strained source/drain regions 51 passing through capping source/drain regions 55. Sidewalls of the silicide layers 81 may be in contact with the capping source/drain regions 55, and bottoms of the silicide layers 81 may be in contact with the strained source/drain regions 51. In some embodiments, the contact patterns 80 may pass through the capping source/drain regions 55 so that the sidewalls of the silicide layers 81 may be in contact with the strained source/drain regions 51. For example, the bottoms of the silicide layers 81 may be in complete contact with the strained source/drain regions 51.

Figure 9A:
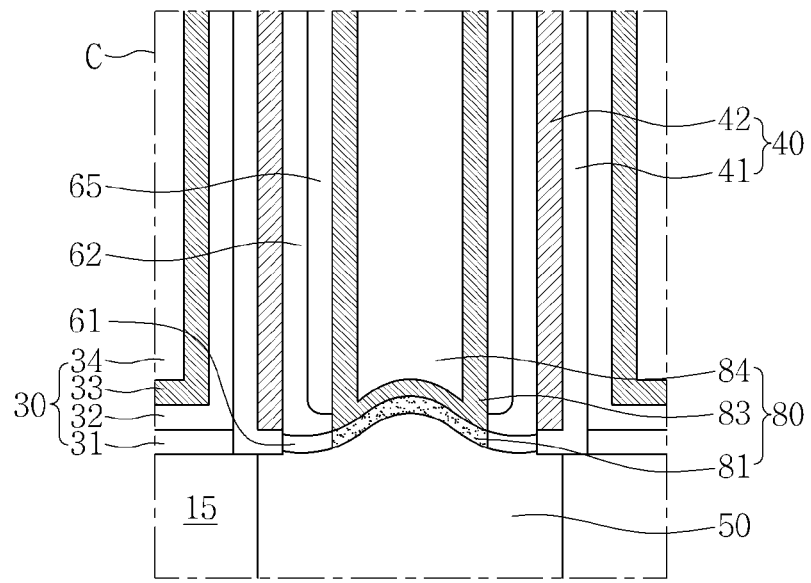
Figure 9B:
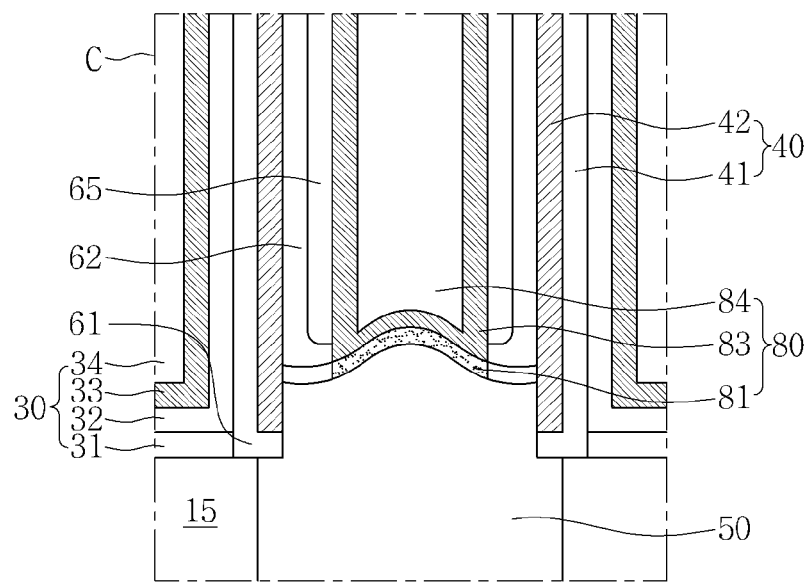

Referring to FIGS. 9A and 9B, semiconductor devices 100c according to various embodiments of the inventive concept may include contact patterns 80 directly formed on strained source/drain regions 51. For example, the capping source/drain regions 55 shown in FIGS. 3A to 8C may be omitted.

Figure 10A:
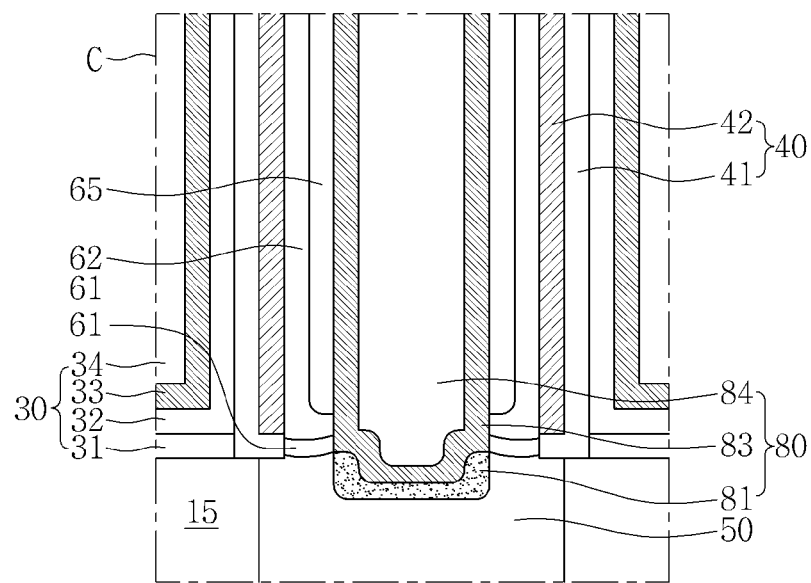
Figure 10B:
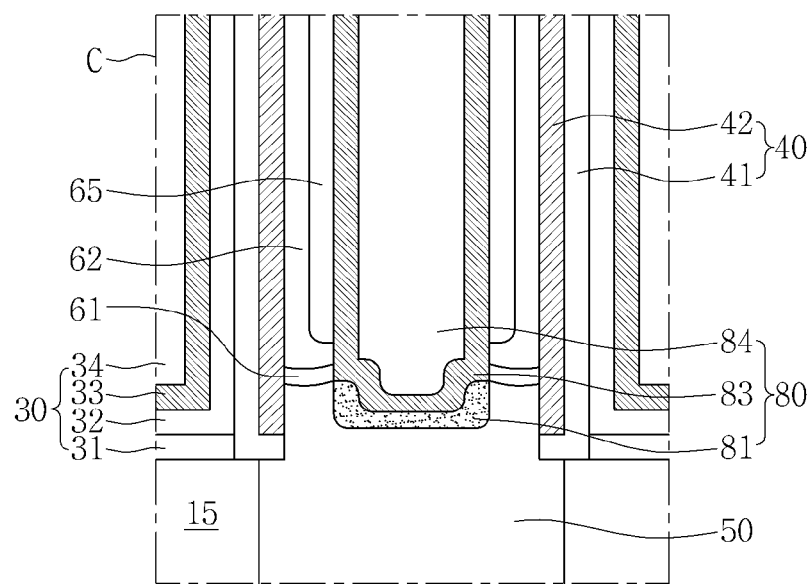

Referring to FIGS. 10A and 10B, semiconductor devices 100c according to various embodiments of the inventive concept may include strained source/drain regions 51 having recessed upper surfaces and contact patterns 80 having silicide layers 81 directly formed on the recessed upper surfaces of the strained source/drain regions 51. The silicide layers 81 on the contact patterns 80 may have bowl-shaped cross sections or U-shaped cross sections. Bottoms of contact barrier layers 83 being in contact with the silicide layers 81 may have bowl-shaped cross sections or U-shaped cross sections.

The source/drain regions 50 of the semiconductor devices 100a, 100b, and 100c according to various embodiments of the inventive concept may include SiC layers so that mobility of electrons, which is one type of carriers, in a channel region of a transistor (e.g., an NMOS transistor) can be improved. Accordingly, the performances of the semiconductor devices 100a, 100b, and 100c may be improved.

The semiconductor devices 100a, 100b, and 100c according to various embodiments of the inventive concepts may include source/drain regions 50 having wave-shaped interfaces. Accordingly, sheet resistance of the source/drain regions 50 may be reduced.

Figure 11A:
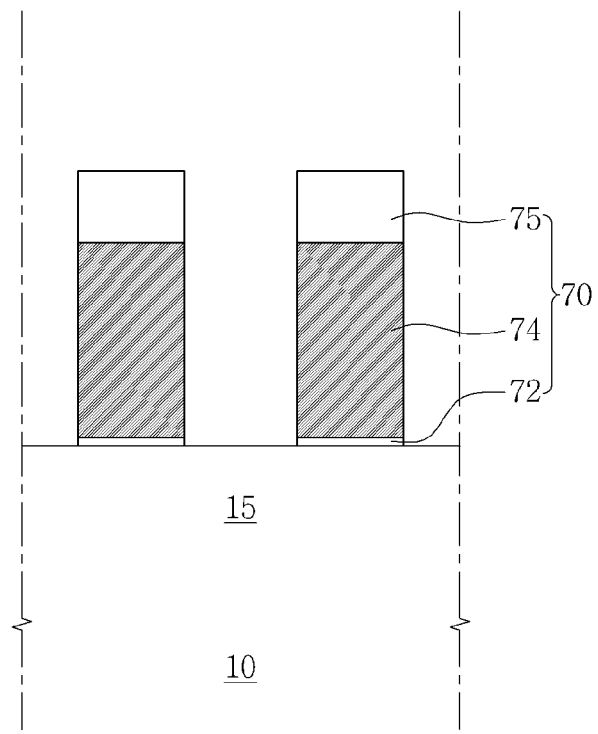
FIGS. 11A to 11N are cross sectional views taken along the line I-I' of FIG. 1 for describing a method of fabricating a semiconductor device according to an embodiment of the inventive concept.
Figure 11B:
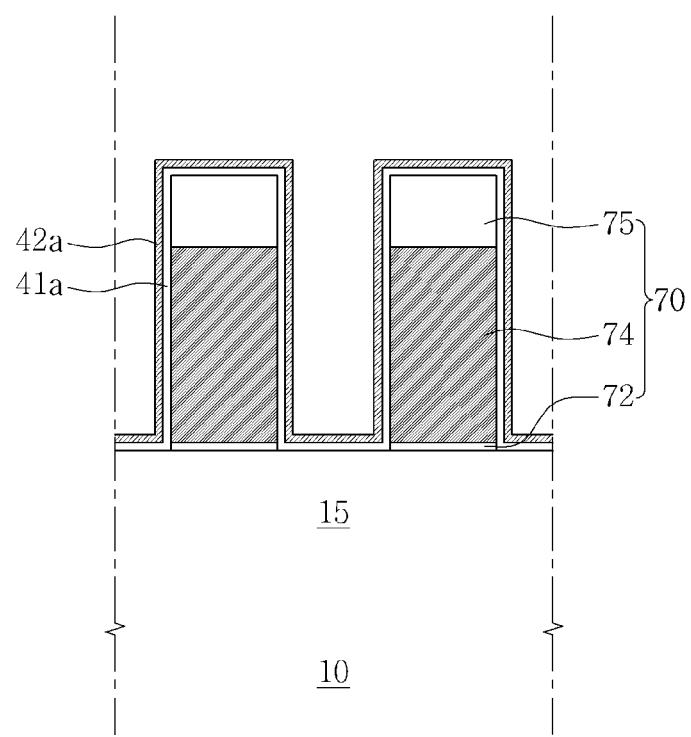
Figure 11C:
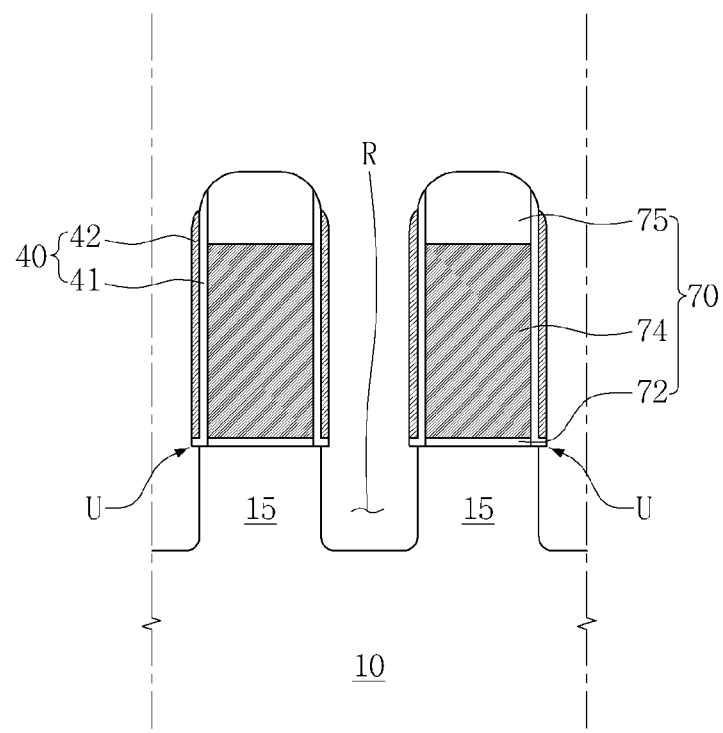
Figure 11D:
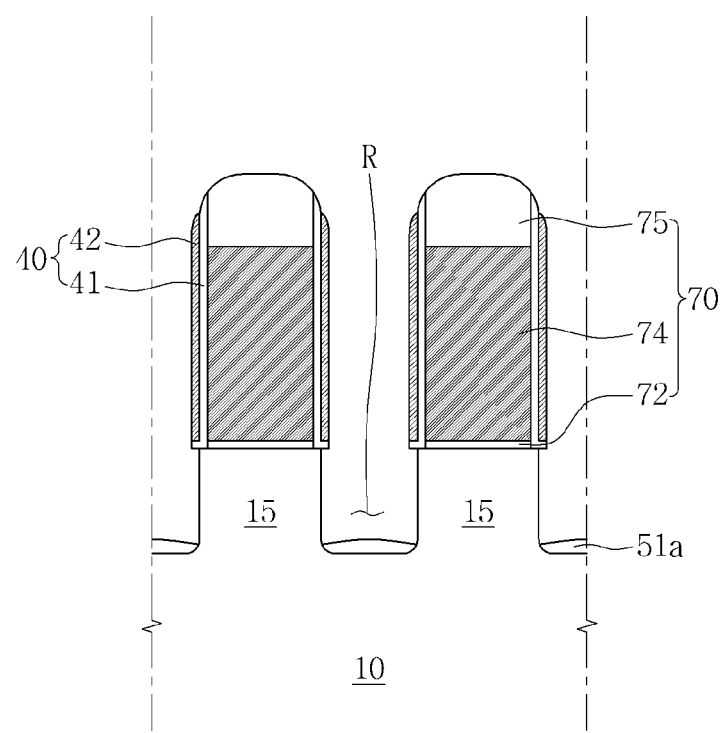
Figure 11E:
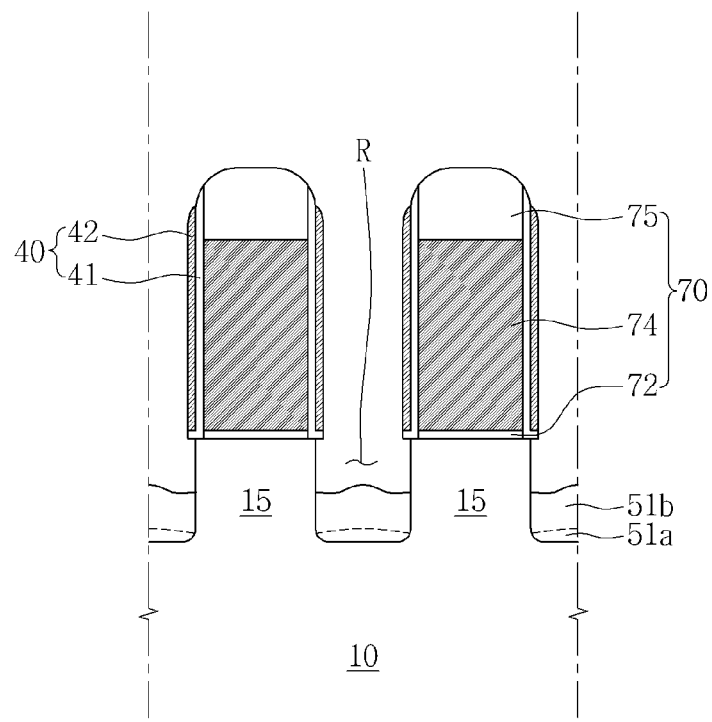
Figure 11F:
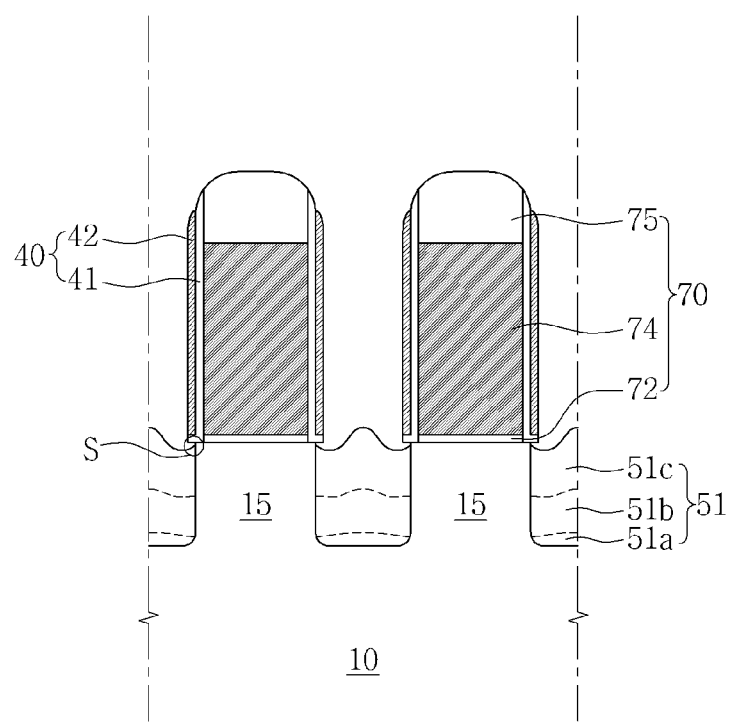
Figure 11G:
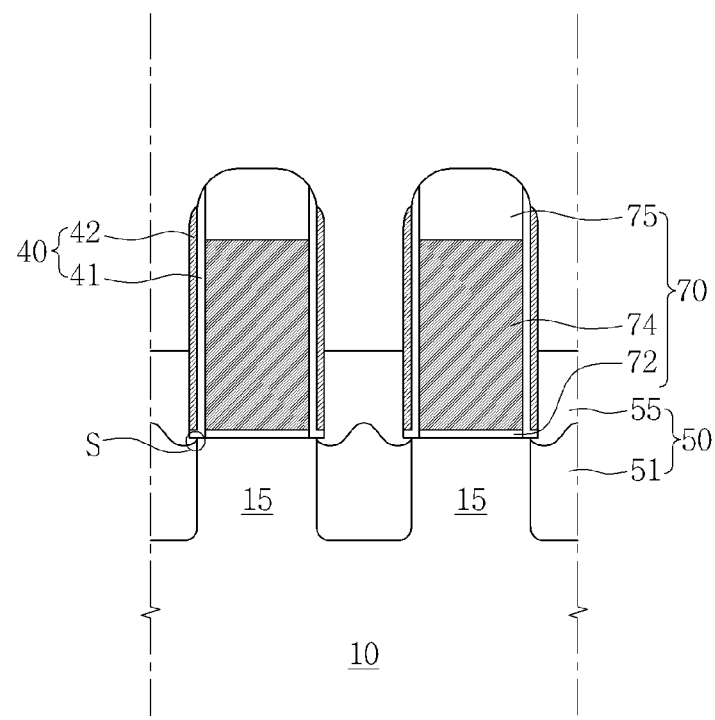
Figure 11H:
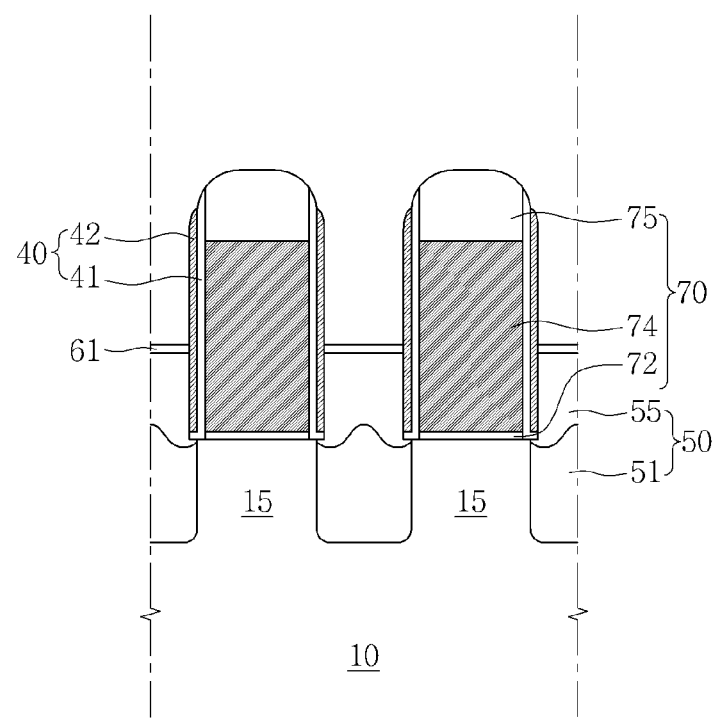
Figure 11I:
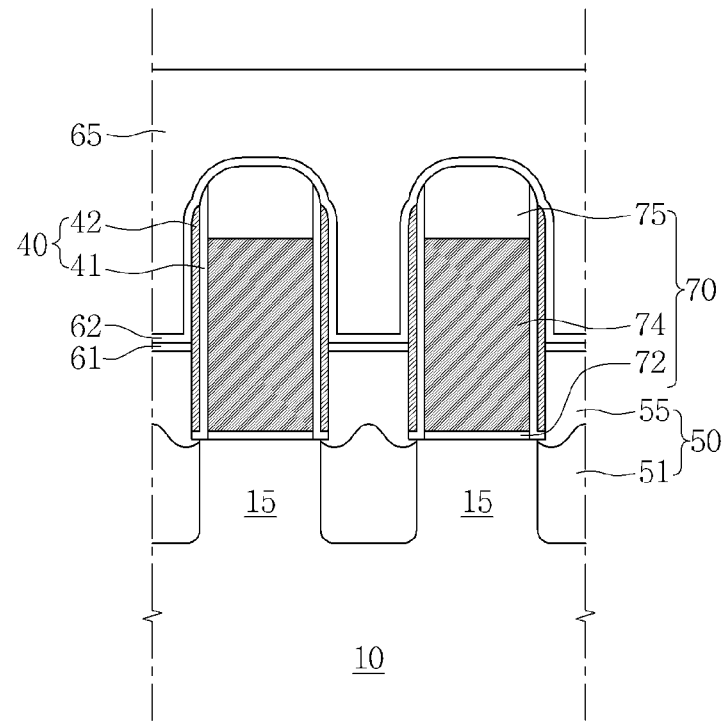
Figure 11J:
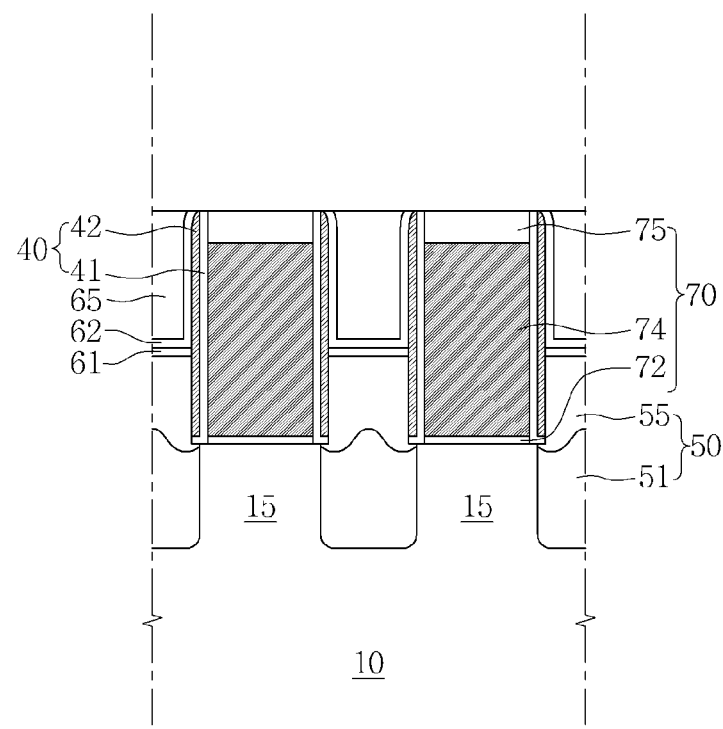
Figure 11K:
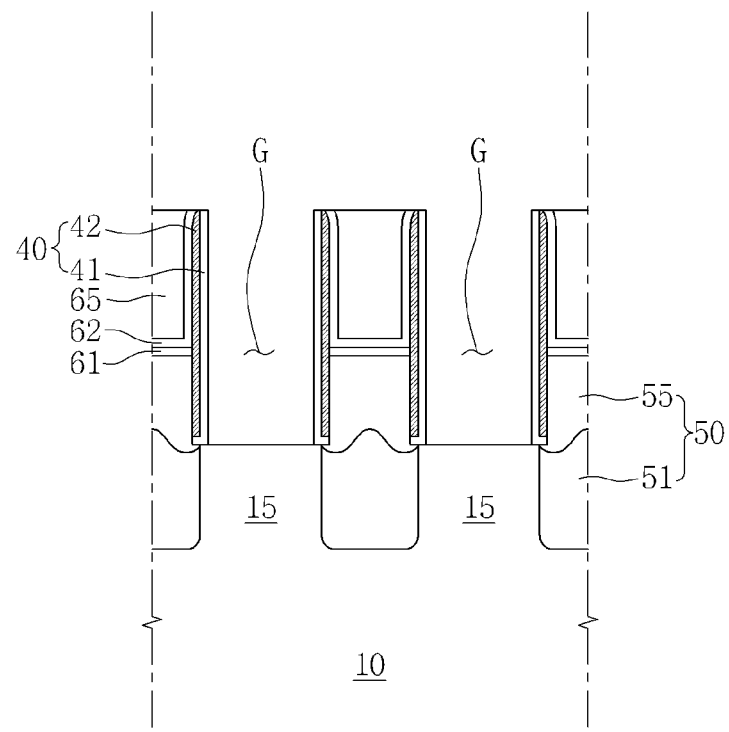
Figure 11L:
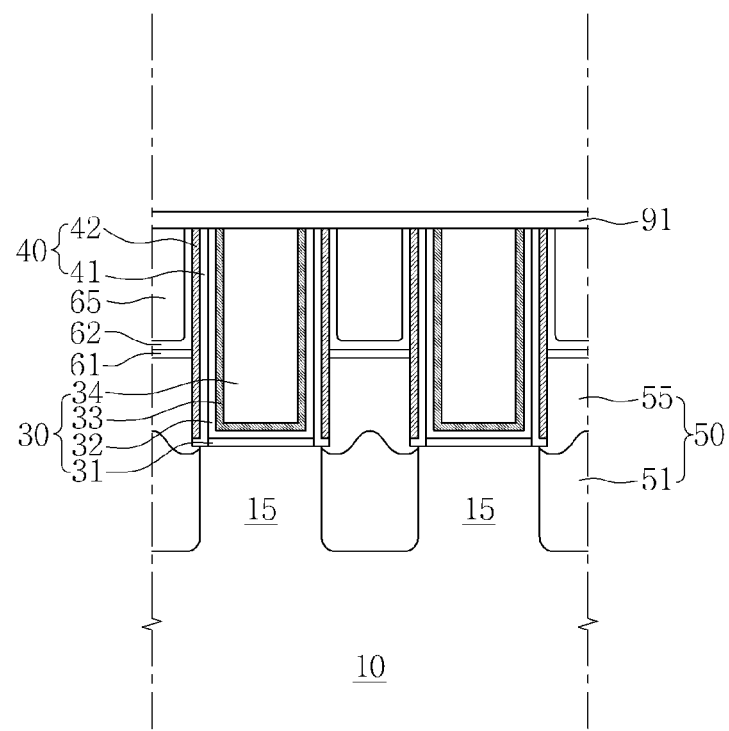
Figure 11M:
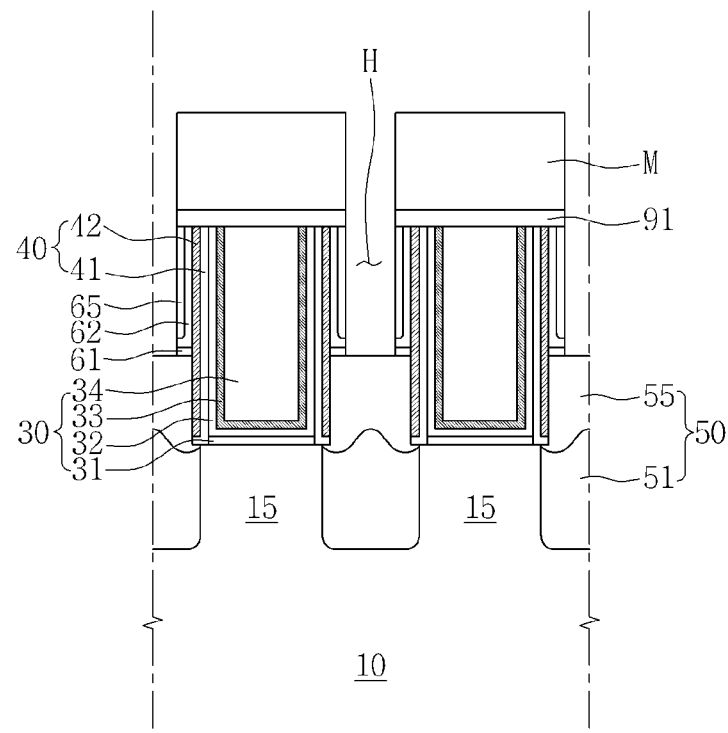
Figure 11N:
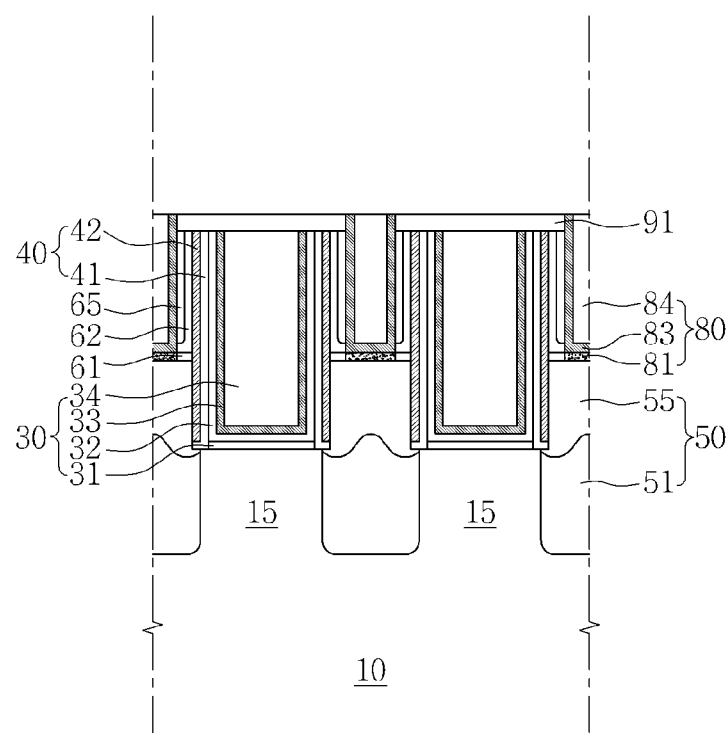

FIGS. 11A to 11N are cross sectional views taken along the line I-I' of FIG. 1 for describing a method of fabricating a semiconductor device in accordance with an embodiment of the inventive concept.

Referring to FIGS. 1 and 11A, a method of fabricating a semiconductor device in accordance with an embodiment of the inventive concept may include forming fin active regions 15 on a substrate 10, and forming sacrificial gate patterns 70.

The substrate 10 may include a single crystalline silicon wafer, an SOI (silicon-on-insulator) wafer, or a SiGe-on-Si wafer.

The fin active regions 15 may protrude from the substrate 10 and extend parallel to each other. The fin active regions 15 may be portions of the substrate 10. For example, the fin active regions 15 may be formed by selectively recessing the substrate 10.

The sacrificial gate patterns 70 may be formed on the fin active regions 15 to be in parallel to each other. The sacrificial gate patterns 70 may include sacrificial gate insulating layers 72, sacrificial gate electrodes 74, and sacrificial gate capping layers 75 on the fin active regions 15.

Referring to FIG. 11B, the method may include performing a deposition process to form an inner gate spacer layer 41a and an outer gate spacer layer 42a conformally covering the fin active regions 15 and the sacrificial gate patterns 70.

The inner gate spacer layer 41a may include an insulating material containing silicon and nitrogen such as silicon nitride (SiN), silicon carbonitride (SiCN), silicon oxynitride (SiON), or silicon carbooxynitride (SiCON). For example, the inner gate spacer layer 41a may include silicon nitride (SiN). The inner gate spacer layer 41a may include the same material as the sacrificial gate capping layers 75.

The outer gate spacer layer 42a may include an insulating material containing silicon (Si) and carbon (C) such as silicon carbon (SiC), silicon carbonitride (SiCN), silicon carbon oxide (SiCO), or silicon carbooxynitride (SiCON). For example, the outer gate spacer layer 42a may include silicon carbooxynitride (SiCON).

Referring to FIG. 11C, the method may include etching the outer gate spacer layer 42a and the inner gate spacer layer 41a to form gate spacers 40 having outer gate spacers 42 and inner gate spacers 41 and etching the fin active regions 15 between the sacrificial gate patterns 70 to form recess regions R. The recess regions R may include undercuts U formed below the gate spacers 40. Upper corner portions of the sacrificial gate capping layers 75 may be partially etched to be rounded.

Referring to FIG. 11D, the method may include performing a cyclic deposition and etching (CDE) process to form lower strained regions 51a in the recess regions R. The CDE process may include multiple and alternative performance of a deposition process and an etching process. The lower strained regions 51a may include single crystalline silicon carbon (SiC). The lower strained regions 51a may include N-type dopants such as phosphorous (P). The N-type dopants may be implanted into the lower strained regions 51a using a simultaneous process with the CDE process or a consecutive in-situ process after the CDE process. The CDE process may be also expressed as cyclic deposition/etch process.

The lower strained regions 51a may be only formed on bottoms of the recess regions R. According to the CDE process, the lower strained regions 51a may grow relatively faster on {100} crystallographic plane and relatively slower on {110} and/or {111} crystallographic planes. Accordingly, the lower strained regions 51a may be formed on the bottoms of the recess regions R to have lightly convex center portions and smooth upper surfaces. For example, the upper surfaces of the lower strained regions 51a may have smooth wave shapes.

Referring to FIG. 11E, the method may include continuously performing the CDE process to form middle strained regions 51b on the lower strained regions 51a. The middle strained regions 51b may also include silicon carbon (SiC). The lower strained regions 51a and the middle strained regions 51b may include the same material so that the lower strained regions 51a and the middle strained regions 51b may be unified to be materially continuous with each other. Thus, interfaces between the lower strained regions 51a and the middle strained regions 51b are indicated using dotted lines in FIGS. 11E and 11F. The middle strained regions 51b may also include N-type dopants such as phosphorous (P). The N-type dopants may be injected into the middle strained regions 51b using a simultaneous process with the CDE process or a consecutive in-situ process after the CDE process.

The upper surfaces of the middle strained regions 51b may be more uneven or curved than the upper surfaces of the lower strained regions 51a, and the center portions thereof may be more convex and less smooth. For example, the upper surfaces of the middle strained regions 51b may have wave shapes with larger heights (trough to peak vertical distances) than that of the upper surface of the lower strained regions 51a.

Referring to FIG. 11F, the method may include continuously further performing the CDE process to form strained source/drain region 51 by forming upper strained regions 51c on the middle strained regions 51b. The upper strained regions 51c may also include silicon carbon (SiC). The upper strained regions 51c may include N-type dopants such as phosphorous (P). The N-type dopants may be injected into the upper strained regions 51c using a simultaneous process with the CDE process or a consecutive in-situ process after the CDE process.

The middle strained regions 51b and the upper strained regions 51c may include the same materials so that the middle strained regions 51b and the upper strained regions 51c may be unified to be materially continuous with each other. Accordingly, interfaces between the middle strained regions 51b and the upper strained regions 51c are indicated using dotted lines in FIG. 11F. The upper surfaces of the upper strained regions 51c may be more uneven than the upper surfaces of the middle strained regions 51b, and the center portions thereof may be more convex and less smooth. For example, the upper surfaces of the upper strained regions 51c may have wave shapes with larger heights (trough to peak vertical distances) than that of the upper surfaces of the middle strained regions 51b.

Spaces S may be formed between the upper surfaces of the upper strained regions 51c and the gate spacers 40. For example, horizontal end portions of the upper strained regions 51c may be disposed in the recess regions R. The highest portion of the upper surfaces of the upper strained regions 51c may protrude over the surfaces of the fin active regions 15. The lowest portion of the upper surfaces of the upper strained regions 51c may be at a level lower than the surfaces of the fin active regions 15. For example, the upper surfaces of the fin active regions 15 may be higher than the upper surfaces of the upper strained regions 51c.

According to a method in accordance with an embodiment of the inventive concept, the strained source/drain regions 51 are formed using the CDE process so that the amount of carbon included in the strained source/drain regions 51 may be increased.

Referring to FIG. 11G, the method may include performing a selectively epitaxial growing process to form capping source/drain regions 55 on the strained source/drain regions 51 so that source/drain regions 50 may be formed with the strained source/drain regions 51 and the capping source/drain regions 55. The capping source/drain regions 55 may protrude from the surfaces of the fin active regions 15. The capping source/drain regions 55 may fill the spaces S between the gate spacers 40 and the strained source/drain regions 51. Upper surfaces of the capping source/drain regions 55 may be substantially and horizontally smooth. For example, the upper surfaces of the capping source/drain regions may be substantially flat. The capping source/drain regions 55 may include a single crystalline silicon (Si) containing N-type dopants such as phosphorous (P).

Referring to FIG. 11H, the method may include forming a buffer layer 61 on the capping source/drain regions 55. The buffer layer 61 may include silicon oxide ($SiO_2$) or silicon nitride (SiN). For example, the buffer layer 61 may include oxidized silicon by oxidizing the surfaces of the capping source/drain regions 55. Alternatively, when the buffer layer 61 include silicon nitride (SiN), the buffer layer 61 may be conformally formed on the sacrificial gate patterns 70 and the gate spacers 40.

The method may further include injecting N-type dopants, such as phosphorous (P), into the capping source/drain regions 55 using the buffer layer 61 as an ion injecting buffer layer.

Referring to FIG. 11I, the method may include performing a deposition process to form a stopper layer 62 on the entire substrate, and forming a lower interlayer insulating layer 65 on the stopper layer 62. The stopper layer 62 may include silicon nitride (SiN), silicon oxynitride (SiON), silicon carbonitride (SiCN), and/or silicon carbooxynitride (SiCON). For example, the stopper layer 62 may include silicon nitride (SiN). The lower interlayer insulating layer 65 may include silicon oxide ($SiO_2$).

Referring to FIG. 11J, the method may include performing a chemical mechanical polishing (CMP) process to expose the sacrificial gate capping layers 75 of the sacrificial gate patterns 70.

Referring to FIG. 11K, the method may include removing the exposed sacrificial gate capping layers 75, the sacrificial gate electrodes 74, and the sacrificial gate insulating layers 72 to form gate trenches G exposing the surfaces of the fin active regions 15.

Referring to FIG. 11L, the method may include forming gate patterns 30 in the gate trenches G. The forming the gate patterns 30 may include forming interfacial insulating layers 31 on the surfaces of the exposed fin active regions 15, forming gate insulating layers 32 on the interfacial insulating layers 31, forming gate barrier layers 33 on the gate insulating layers 32, forming gate electrodes 34 on the gate barrier layers 33, and performing a CMP process to planarize the gate insulating layers 32, the gate barrier layers 33, and the gate electrodes 34. The method may further include forming a lower capping layer 91 on the planarized gate patterns 30 and the lower interlayer insulating layer 65.

The interfacial insulating layers 31 may include oxidized silicon by oxidizing the surfaces of the fin active regions 15, the gate insulating layers 32 may include a metal oxide such as hafnium oxide (HfO), the gate barrier layers 33 may include a barrier metal such as titanium (Ti), titanium nitride (TiN), tantalum (Ta), or tantalum nitride (TaN), and the gate electrodes 34 may include a metal such as tungsten (W).

The lower capping layer 91 may include at least one of silicon nitride (SiN), silicon oxynitride (SiON), silicon carbonitride (SiCN), and silicon carbooxynitride (SiCON). For example, the lower capping layer 91 may include silicon nitride (SiN).

Referring to FIG. 11M, the method may include forming a mask pattern M, and forming contact holes H exposing the surfaces of the capping source/drain regions 55 using the mask pattern M as a patterning mask. The mask pattern M may include photoresist or a multi-layered inorganic hard mask layer. In some embodiments, the lower interlayer insulating layer 65, the stopper layers 62, and the buffer layers 61 around the contact holes H may be partially or fully removed so that the contact holes H may be expanded. Then, the mask pattern M may be removed.

Referring to FIG. 11N, the method may include forming contact patterns 80 in the contact holes H. The forming the contact patterns 80 may include forming silicide layers 81 on the surfaces of the capping source/drain regions 55 exposed in the contact holes H, forming contact barrier layers 83 on the silicide layers 81, forming contact plugs 84 on the contact barrier layers 83, and performing a CMP process to planarize upper surfaces of the contact barrier layers 83 and the contact plugs 84.

The silicide layers 81 may include tungsten silicide (WSi), nickel silicide (NiSi), titanium silicide (TiSi), cobalt silicide (CoSi), or other metal silicides which are formed by silicidation processes. The contact barrier layers 83 may include titanium (Ti), titanium nitride (TiN), tantalum (Ta), tantalum nitride (TaN), or other barrier metals which are formed by a deposition process. The contact plugs 84 may include tungsten (W), copper (Cu), titanium (Ti), or a metal or a metal compound formed by deposition processes or plating processes.

Next, referring to FIGS. 2A and 3A, the method may further include forming an upper capping layer 92 and upper interlayer insulating layer 95 on the planarized contact patterns 80 and the lower capping layer 91. The upper capping layer 92 may include at least one of silicon nitride (SiN), silicon oxynitride (SiON), silicon carbonitride (SiCN), and silicon carbooxynitride (SiCON). For example, the upper capping layer 92 may include silicon nitride (SiN). The upper interlayer insulating layer 95 may include silicon oxide ($SiO_2$).

Figure 12A:
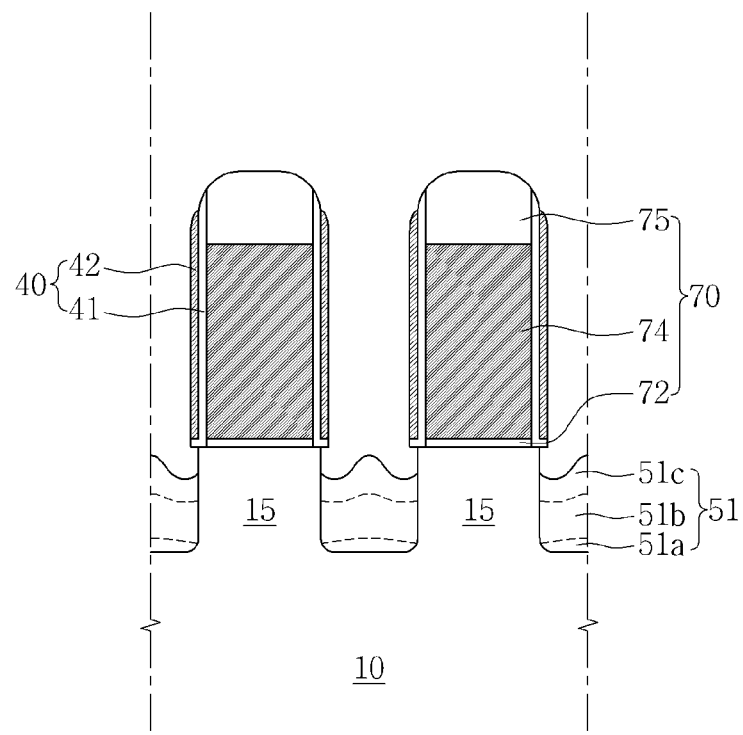
FIGS. 12A and 12B are cross sectional views taken along the line I-I' of FIG. 1 for describing methods of fabricating semiconductor devices according to various embodiments of the inventive concept.
Figure 12B:
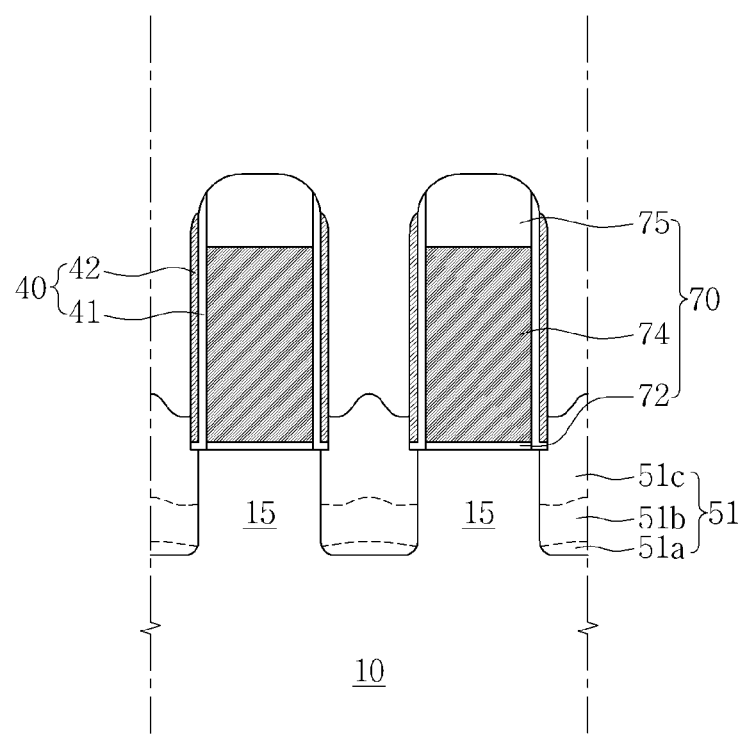

FIGS. 12A and 12B are cross sectional views taken along the line I-I' of FIG. 1 for describing methods of fabricating semiconductor devices according to various embodiments of the inventive concept.

Referring to FIG. 12A, a method of fabricating a semiconductor device in accordance with an embodiment of the inventive concept may include performing the processes described with reference to FIGS. 11A to 11F to form the strained source/drain regions 51 so that the highest portions of the upper surfaces of the upper strained regions 51c may be at the same level as or at a lower level than the surfaces of the fin active regions 15. Next, the method may include performing the processes described with reference to FIGS. 11G to 11N to form the semiconductor device 100a shown in FIGS. 2A and 3B.

Referring FIG. 12B, a method of fabricating a semiconductor device in accordance with an embodiment of the inventive concept may include performing the processes described with reference to FIGS. 11A to 11F to form strained source/drain regions 51 so that the lowest portions of upper surfaces of the upper strained regions 51c may be at the same level as or at a higher level than the upper surfaces of the fin active regions 15. Next, the method may include performing the processes described with reference to FIGS. 11G to 11N to form the semiconductor device 100a shown in FIGS. 2A and 3C.

FIGS. 13 to 19 are cross sectional views taken along the line I-I' of FIG. 1 for describing methods of fabricating semiconductor devices according to various embodiments of the inventive concepts.

Figure 13:
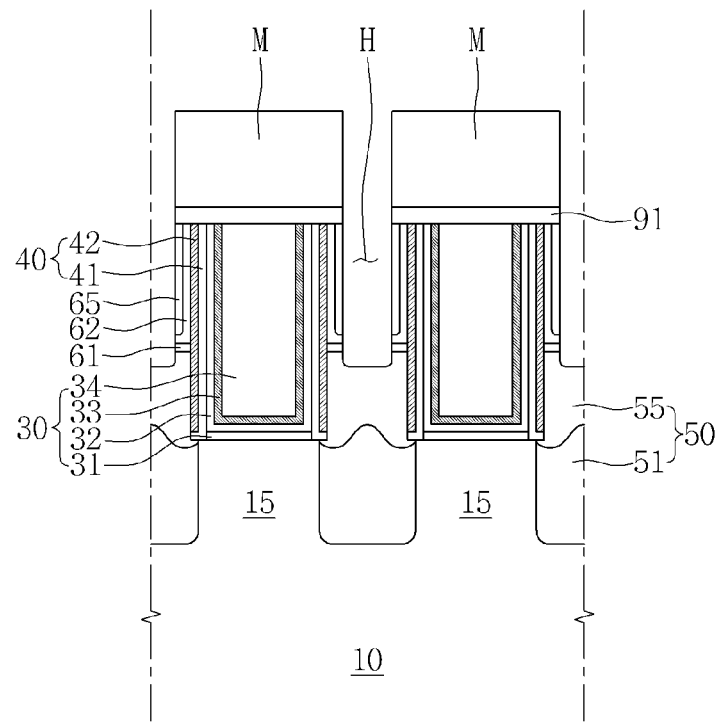
FIGS. 13 to 19 are cross sectional views taken along the line I-I' of FIG. 1 for describing methods of fabricating semiconductor devices according to various embodiments of the inventive concepts.

Referring to FIG. 13, a method of a fabricating a semiconductor device in accordance with an embodiment of the inventive concept may include performing the processes described with reference to FIGS. 11A and 11M and/or 12A or 12B to form contact holes H passing through the lower interlayer insulating layer 65, the stopper layer 62, and the buffer layer 61 to expose the insides of the capping source/drain regions 55. The upper surfaces of the capping source/drain regions 55 may be recessed so that bottoms of the contact holes H may be located in the capping source/drain regions 55. Next, referring to FIGS. 11N and 4A to 4C, the method may include forming contact patterns 80 including the capping source/drain regions 55 having the recessed upper surfaces and the silicide layers 81 having bowl shaped sections or U-shaped cross sections on the recessed upper surfaces of the capping source/drain regions 55.

Figure 14:
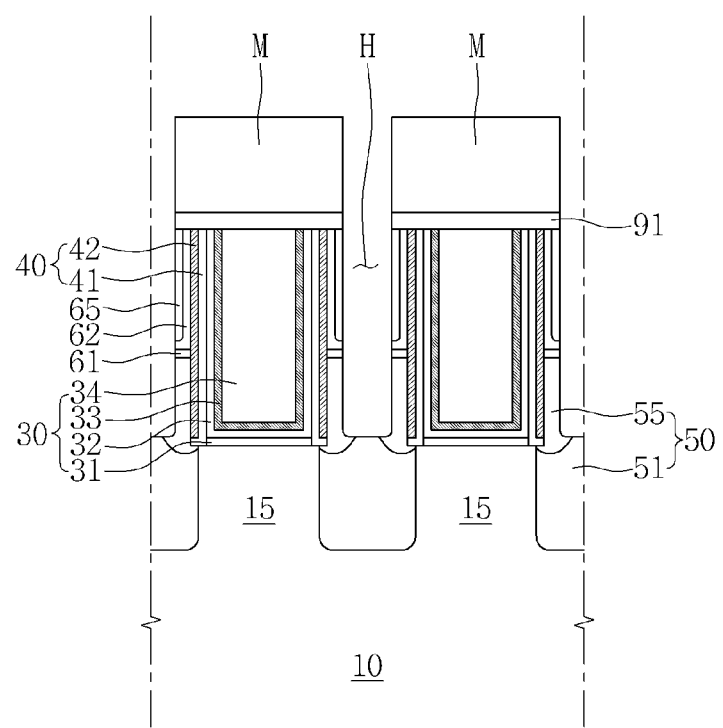

Referring to FIG. 14, a method in accordance with an embodiment of the inventive concept may include performing the process described with reference to FIGS. 11A to 11M and/or 12A or 12B to form the contact hole H passing through the lower interlayer insulating layer 65, the stopper layer 62, the buffer layer 61, and the capping source/drain region 55 to expose the strained source/drain region 51. The bottom of the contact hole H may be recessed and/or located in strained source/drain region 51 to expose the strained source/drain region 51. Next, referring to FIGS. 11N and 5A to 5C, the method may include forming the contact patterns 80 including the silicide layers 81 having bowl shaped sections or U-shaped cross sections in the contact holes H.

Figure 15A:
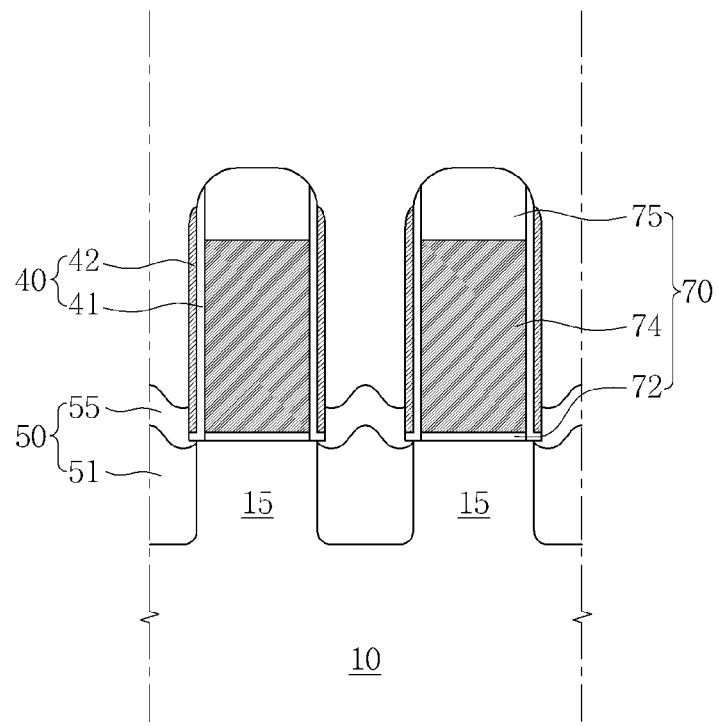

Referring to FIG. 15A, a method of fabricating a semiconductor device in accordance with an embodiment of the inventive concept may include performing the processes described with reference to FIGS. 11A to 11G to form the strained source/drain regions 51 and the capping source/drain regions 55 so that the upper surfaces of the capping source/drain regions 55 may have curved or waved shapes.

Figure 15B:
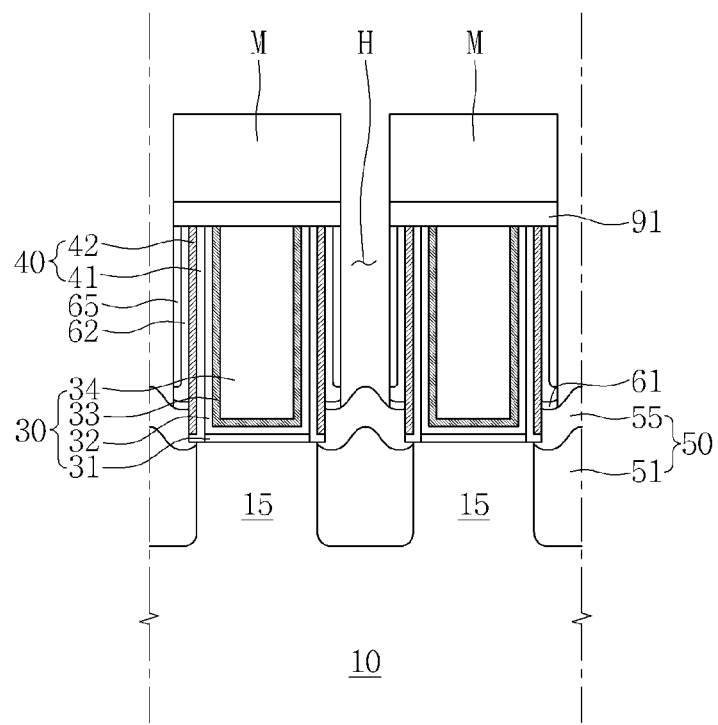

Referring to FIG. 15B, the method may include performing the processes described with reference to FIGS. 11H to 11M to form the contact holes H so that the curved surfaces of the capping source/drain regions 55 may be exposed in the bottoms of the contact holes H. Next, the method may include performing the processes described with reference to FIG. 11N to form the semiconductor device 100b shown in FIG. 2B having either the source/drain regions 50 or the contact patterns 80 shown in FIGS. 6A to 6C.

Figure 16:
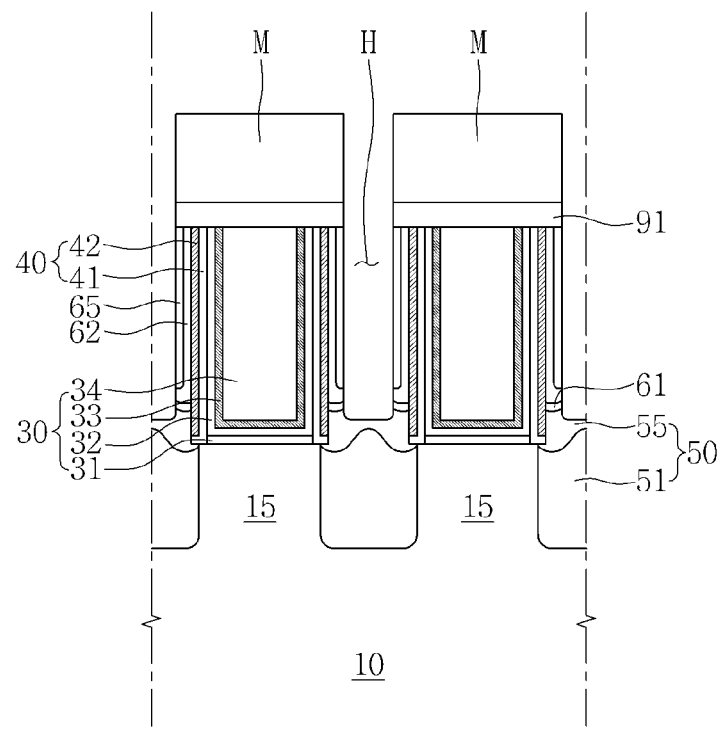

Referring to FIG. 16, a method of fabricating a semiconductor device in accordance with an embodiment of the inventive concept may include performing the processes described with reference to FIGS. 11A to 11G, 15A, and 15B to form the contact holes H so that the insides of the capping source/drain regions 55 may be exposed in the bottoms of the contact holes H. The upper surfaces of the capping source/drain regions 55 may be recessed so that the bottoms of the contact holes H may be located in the capping source/drain regions 55. Next, the method may include performing the processes described with reference to FIGS. 11H to 11M to form the capping source/drain regions 55 having the recessed upper surfaces and the contact patterns 80 including the silicide layers 81 having U-shaped cross sections on the recessed upper surfaces of the capping source/drain regions 55 shown in FIGS. 7A to 7C.

Figure 17:
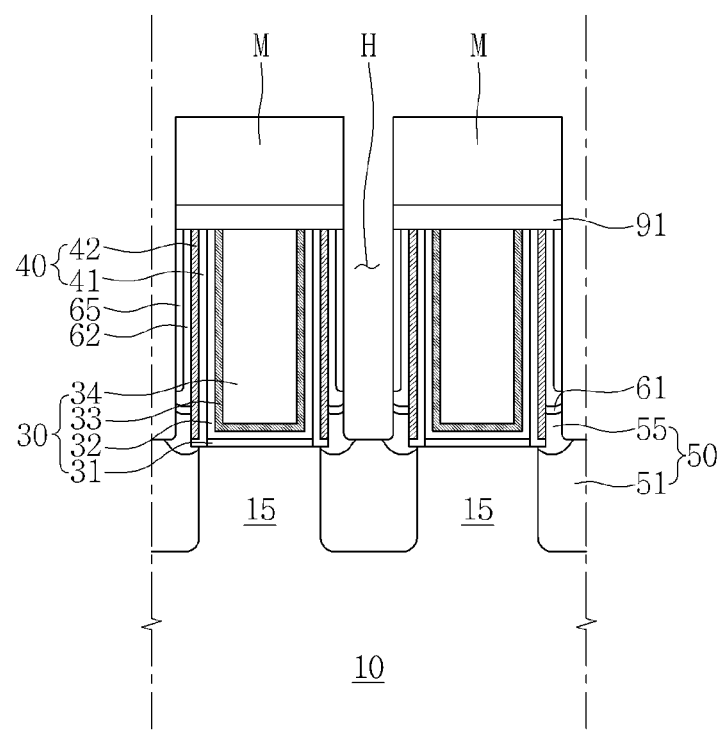

Referring to FIG. 17, a method of fabricating a semiconductor device in accordance with an embodiment of the inventive concept may include performing the processes described with reference to FIGS. 11A to 11G, 15A, and 15B to form the contact holes H so that the upper surfaces or the insides of the strained source/drain regions 51 may be exposed in the bottoms of the contact holes H. Next, the method may include performing the processes described with reference to FIGS. 11H to 11M to form the source/drain regions 50 including the strained source/drain regions 51 having the recessed upper surfaces and the capping source/drain regions 55, and the contact patterns 80 including the silicide layers 81 having U-shaped cross sections shown in FIGS. 8A to 8C.

Figure 18:
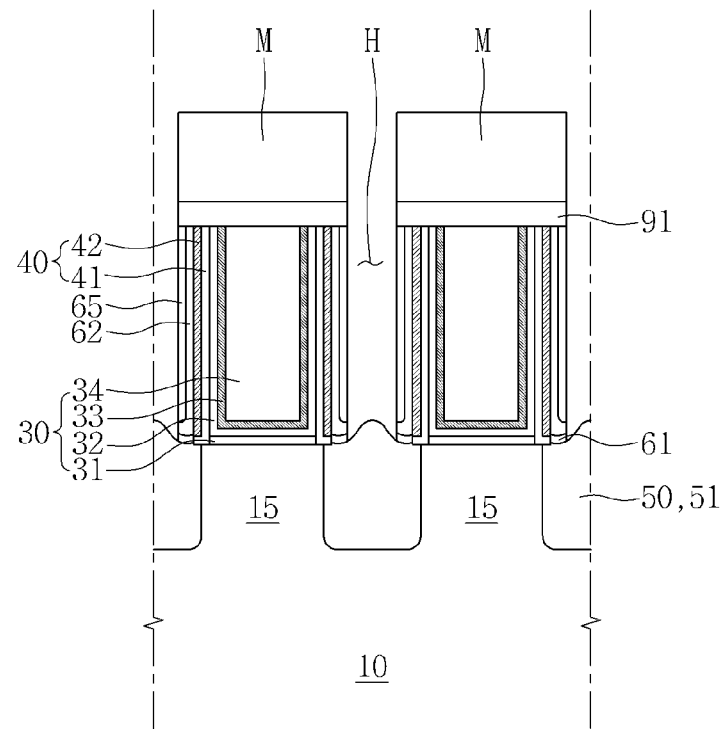

Referring to FIG. 18, a method of fabricating a semiconductor device in accordance with an embodiment of the inventive concept may include performing the processes described with reference to FIGS. 11A to 11F to form the strained source/drain regions 51, performing the processes described with reference to FIG. 11H to directly form the buffer layers 61 on the strained source/drain regions 51, and performing the processes described with reference to FIGS. 11I to 11M to form the contact holes H exposing the upper surfaces of the strained source/drain regions 51. Next, the method may include performing the processes described with reference to FIG. 11N to form the strained source/drain regions 51 and contact patterns 80 shown in FIGS. 9A and 9B so that the method may include forming the semiconductor device 100c shown in FIG. 2C.

Figure 19:
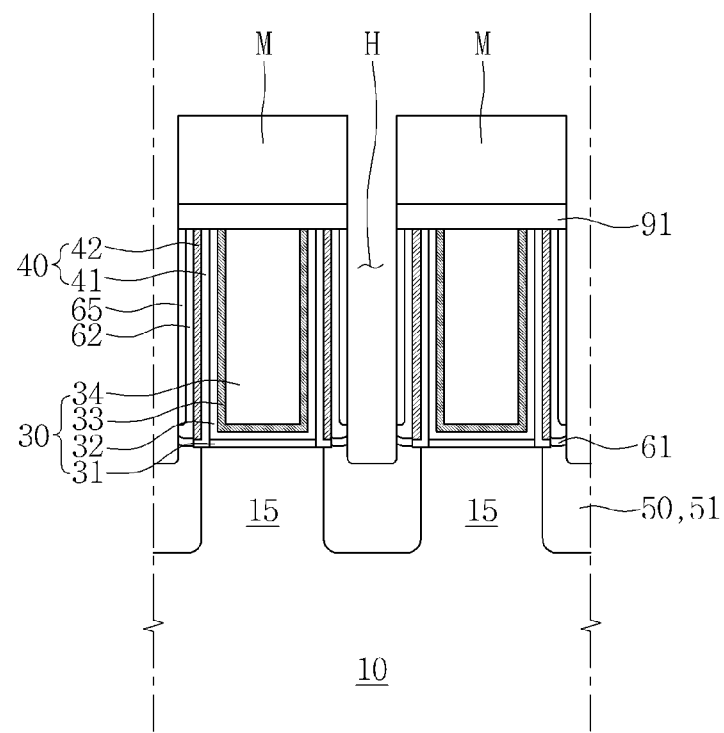

Referring to FIG. 19, a method of fabricating a semiconductor device in accordance with an embodiment of the inventive concept may include performing the processes described with reference to FIGS. 11A to 11F to form the strained source/drain regions 51, performing the processes described with reference to FIG. 11H to directly form the buffer layers 61 on the strained source/drain regions 51, and performing the processes described with reference to FIGS. 11I to 11M to form the contact holes H exposing the recessed upper surfaces of the strained source/drain regions 51. Next, the method may include performing the process described with reference to FIG. 11N to form the strained source/drain regions 51 and the contact patterns 80 shown in FIGS. 9A to 9B so that the method may include forming the semiconductor device 100c shown in FIG. 2C.

Figure 20A:
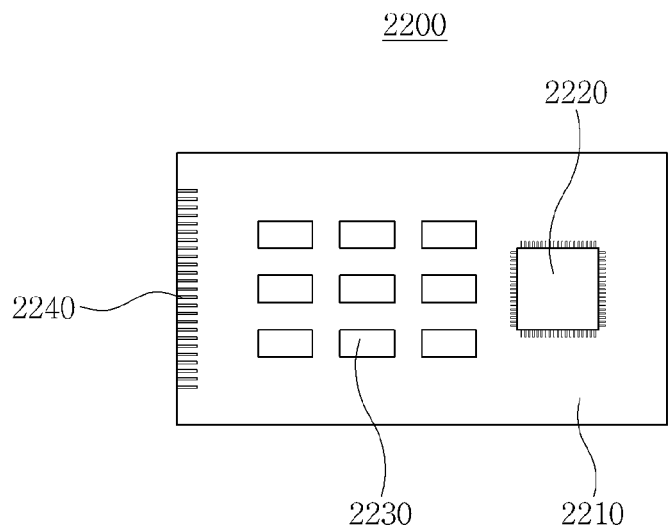
FIG. 20A is a diagram conceptually showing a semiconductor module according to an embodiment of the inventive concept.

FIG. 20A is a diagram conceptually showing a semiconductor module 2200 in accordance with an embodiment of the inventive concept. Referring to FIG. 20A, the semiconductor module 2200 in accordance with the embodiment of the inventive concept may include a processor 2220 and semiconductor devices 2230 mounted on a module substrate 2210. The processor 2220 or the semiconductor devices 2230 may include at least one of the semiconductor devices 100a to 100c according to various embodiments of the inventive concept. Conductive input/output terminals 2240 may be disposed on at least one side of the module substrate 2210.

Figure 20B:
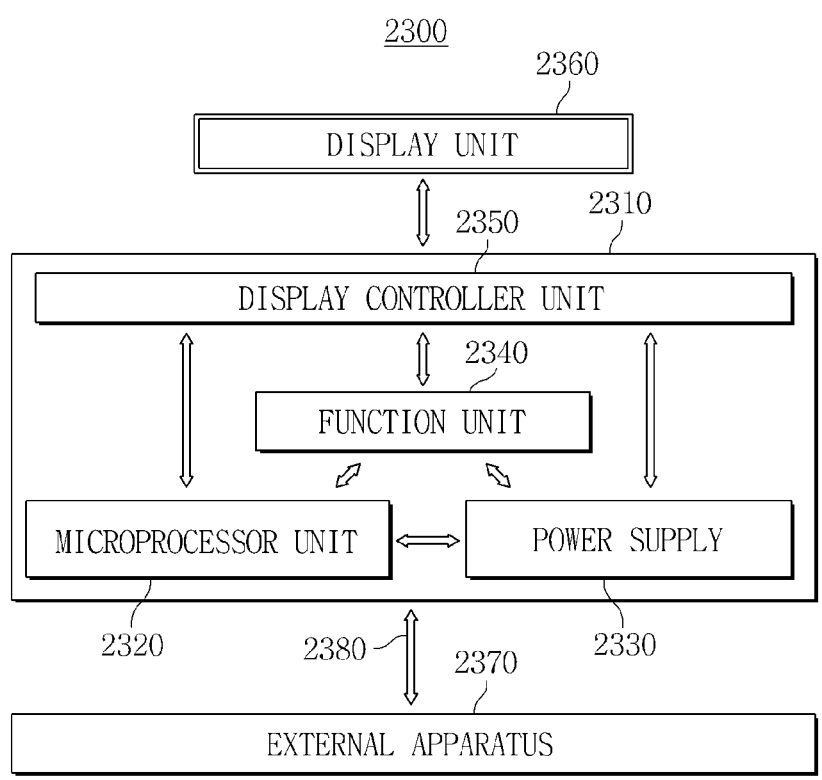
FIGS. 20B and 20C are block diagrams conceptually showing electronic systems according to certain embodiments of the inventive concept.

FIG. 20B is a block diagram conceptually showing electronic systems 2300 in accordance with an embodiment of the inventive concepts. Referring to FIG. 20B, the electronic system 2300 in accordance with the embodiment of the inventive concept may include a body 2310, a display unit 2360, and an external apparatus 2370. The body 2310 may include a microprocessor unit 2320, a power supply 2330, a function unit 2340, and/or a display controller unit 2350. The body 2310 may include a system board or mother board including a PCB and/or a case. The microprocessor unit 2320, the power supply 2330, the function unit 2340, and the display controller unit 2350 may be mounted or disposed on an upper surface or inside of the body 2310. The display unit 2360 may be disposed on the upper surface of the body 2310 or inside/outside of the body 2310. The display unit 2360 may display an image processed by the display controller unit 2350. For example, the display unit 2360 may include a liquid crystal display (LCD), active matrix organic light emitting diodes (AMOLED), or various display panels. The display unit 2360 may include a touch screen. For example, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for a dry cell, or a voltage/current converter. The microprocessor unit 2320 may receive a voltage from the power supply 2330 to control the function unit 2340 and the display unit 2360. For example, the microprocessor unit 2320 may include a central processor unit (CPU) or an application processor (AP). The function unit 2340 may include a touchpad, a touchscreen, a volatile/nonvolatile memory, a memory card controller, a camera, a lighting, an audio and video playback processor, a wireless transmission/reception antenna, a speaker, a microphone, a Universal Serial Bus (USB) port, and other units having various functions. The microprocessor unit 2320 or the function unit 2340 may include at least one of the semiconductor devices 100a to 100c according to various embodiments of the inventive concept.

Figure 20C:
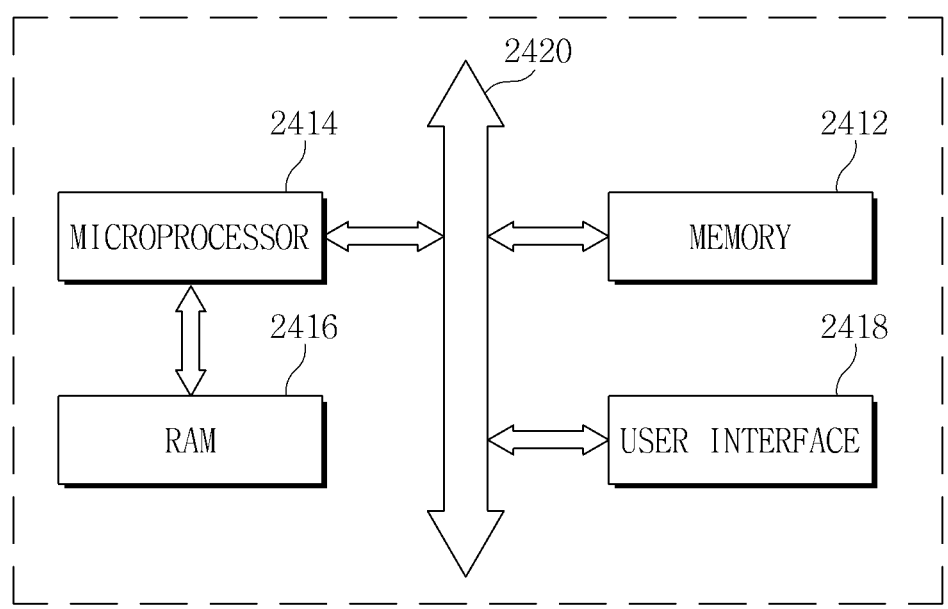

FIG. 20C is a block diagram conceptually showing an electronic system 2400 according to various embodiments of the inventive concept. Referring to FIG. 20C, the electronic system 2400 in accordance with an embodiment of the inventive concept may include a microprocessor 2414, a memory 2412, and a user interface 2418 which perform data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used for data input to or output from the electronic system 2400. For example, the user interface 2418 may include a touchpad, a touchscreen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 100a to 100c according to various embodiments of the inventive concept.

According to embodiments of the inventive concept, the semiconductor device may include source/drain regions having an SiC layer.

According to embodiments of the inventive concept, the semiconductor device may include source/drain regions containing a great amount of carbon.

According to embodiments of the inventive concept, the mobility and performance of electrons serving as one of carriers of the semiconductor device may be improved.

According to embodiments of the inventive concept, the semiconductor device may include a source/drain region having a reduced sheet resistance.

According to embodiments of the inventive concept, the interface contact area between a contact pattern and a source/drain region of the semiconductor device is increased so that contact resistance of the interface contact area may be reduced.

Although a few embodiments have been described, those skilled in the art will readily appreciate that many modifications are possible without materially departing from the novel teachings and advantages. Accordingly, all such modifications are intended to be included within the scope of the inventive concepts as defined in the claims.

What is claimed is:

1. A semiconductor device comprising:
    a fin active region protruding from a substrate;
    gate patterns on the fin active region, the gate patterns extending in a first direction over the fin active region including across a first sidewall of the fin active region to a second sidewall of the fin active region;
    a source/drain region on the fin active region between the gate patterns; and
    contact patterns on the source/drain region,
    wherein the source/drain region comprises a wave-shaped upper surface with respect to a vertical cross-sectional view that is perpendicular to the first direction.

2. The semiconductor device of claim 1, wherein the source/drain region comprises silicon carbon (SiC).

3. The semiconductor device of claim 1, further comprising a capping source/drain region on the source/drain region.

4. The semiconductor device of claim 3, wherein the capping source/drain region comprises epitaxially grown silicon (Si).

5. The semiconductor device of claim 3, wherein the capping source/drain region has a substantially flat upper surface.

6. The semiconductor device of claim 3, wherein the capping source/drain region has a curved upper surface.

7. The semiconductor device of claim 1, wherein the contact pattern comprises:
    a silicide layer on the source/drain region;
    a contact barrier layer on the silicide layer; and
    a contact plug on the contact barrier layer.

8. The semiconductor device of claim 7, wherein:
    the source/drain region comprises a recessed upper surface; and
    the silicide layer is formed on the recessed upper surfaces of the source/drain region to have a bowl shape.

9. The semiconductor device of claim 7, wherein the silicide layer of the contact pattern is in contact with the source/drain region.

10. A semiconductor device comprising:
    a substrate provided with a fin active region;
    gate patterns disposed on the fin active region;

a source/drain region protruding from the fin active region between the gate patterns; and a contact pattern disposed on the source/drain region, wherein the source/drain region comprises a lower source/drain region and a capping source/drain region disposed on the lower source/drain region, and an interface between the lower source/drain region and the capping source/drain region has a wave shape.

11. The semiconductor device of claim 10, wherein:

the lower source/drain region is disposed within a trench formed in the fin active region; and the capping source/drain region is disposed on the lower source/drain region to protrude above the surface of the fin active region.

12. The semiconductor device of claim 10, further comprising gate spacers disposed on sidewalls of the gate patterns, wherein the capping source/drain region is in contact with the gate spacers.

13. The semiconductor device of claim 10, wherein the interface comprises a protruding center portion, a recessed inner portion around the center portion, and an outer portion around the inner portion, wherein the outer portion is located at a level lower than the center portion and higher than the inner portion.

14. The semiconductor device of claim 10, wherein the gate patterns extend in a first direction over the fin active region including across a first sidewall of the fin active region to a second sidewall of the fin active region, and wherein the interface between the lower source/drain region and the capping source/drain region has a wave shape with respect to a vertical cross-sectional view that is perpendicular to the first direction.

15. A semiconductor device comprising:

a substrate provided with fin active regions, the fin active regions extending parallel to each other;

gate patterns extending parallel to each other and crossing the fin active regions;

source/drain regions formed on the fin active regions in recesses in the fin active regions between the gate patterns; and contact patterns disposed on the source/drain regions, wherein the source/drain regions comprise:

lower source/drain regions disposed in the recesses of the fin active regions; and upper source/drain regions disposed on the lower source/drain regions protruding above surfaces of the fin active regions, wherein each lower source/drain regions comprises a protruding center portion and a recessed inner portion adjacent to a corresponding center portion.

16. The semiconductor device of claim 15, wherein the contact patterns comprise:

silicide layers disposed on the upper source/drain regions;

contact barrier layers disposed on the silicide layers; and contact plugs disposed on the contact barrier layers, wherein the silicide layers and the contact barrier layers extend into the upper source/drain regions.

17. The semiconductor device of claim 16, wherein the contact patterns are in contact with the lower source/drain regions.

18. The semiconductor device of claim 15, wherein the gate patterns comprise:

interfacial insulating layers directly disposed on the fin active regions and having a sheet shaped cross section;

gate insulating layers disposed on the interfacial insulating layers and having a U-shaped cross section;

gate barrier layers directly disposed on the gate insulating layers and having a U-shaped cross section; and gate electrodes disposed on the gate barrier layers.

19. The semiconductor device of claim 15, wherein the center portions of the lower source/drain regions protrude over the fin active regions.

20. The semiconductor device of claim 15, wherein the gate patterns extend in a first direction over the fin active regions including across a first sidewall to a second sidewall of each of the fin active regions, and wherein each of the lower source/drain regions has a wave shape with respect to a vertical cross-sectional view that is perpendicular to the first direction.

* * * * *